US011605686B2

(12) United States Patent
Won et al.

(10) Patent No.: US 11,605,686 B2
(45) Date of Patent: Mar. 14, 2023

(54) DISPLAY APPARATUS COMPRISING A FIRST AUXILIARY WIRING LAYER HAVING A FIRST TIP PROTRUDING FROM A FIRST SIDE SURFACE OF AN ORGANIC INSULATING LAYER

(71) Applicant: SAMSUNG DISPLAY CO., LTD., Yongin-si (KR)

(72) Inventors: Byeonghee Won, Yongin-si (KR); Junhyeong Park, Yongin-si (KR); Jaemin Shin, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 177 days.

(21) Appl. No.: 17/202,810

(22) Filed: Mar. 16, 2021

(65) Prior Publication Data
US 2022/0013609 A1 Jan. 13, 2022

(30) Foreign Application Priority Data
Jul. 7, 2020 (KR) .......................... 10-2020-0083672

(51) Int. Cl.
*H01L 29/08* (2006.01)
*H01L 27/32* (2006.01)
*H01L 51/52* (2006.01)

(52) U.S. Cl.
CPC ...... *H01L 27/3262* (2013.01); *H01L 27/3246* (2013.01); *H01L 27/3265* (2013.01); *H01L 27/3276* (2013.01); *H01L 51/5253* (2013.01)

(58) Field of Classification Search
CPC ............. H01L 27/3262; H01L 27/3246; H01L 27/3265; H01L 27/3276; H01L 51/5253

USPC .......................................................... 257/40
See application file for complete search history.

(56) References Cited

U.S. PATENT DOCUMENTS

| 9,859,520 | B2 | 1/2018 | Kim |
| 10,050,223 | B2 | 8/2018 | Im et al. |
| 10,263,211 | B2 | 4/2019 | Byun et al. |
| 2011/0316007 | A1* | 12/2011 | Sagawa ............... H01L 27/3258 257/E33.062 |

(Continued)

FOREIGN PATENT DOCUMENTS

| KR | 1020160062646 A | 6/2016 |
| KR | 1020180046229 A | 6/2016 |

(Continued)

*Primary Examiner* — Phuc T Dang
(74) *Attorney, Agent, or Firm* — Cantor Colburn LLP

(57) ABSTRACT

A display apparatus includes a substrate including a base portion and a plurality of connection portions extending from the base portion in different directions, a pixel circuit arranged on the base portion and including a thin-film transistor and a storage capacitor, an organic insulating layer on the pixel circuit, a pixel electrode arranged on the organic insulating layer and electrically connected to the pixel circuit, a first auxiliary wiring layer arranged on the organic insulating layer, an opposite electrode overlapping the pixel electrode, and an emission layer between the pixel electrode and the opposite electrode. The organic insulating layer includes a first recess portion, the first auxiliary wiring layer has a first tip protruding from a side surface of the organic insulating layer in a width direction of the first auxiliary wiring layer, and the side surface defines the first recess portion.

20 Claims, 13 Drawing Sheets

(56) References Cited

U.S. PATENT DOCUMENTS

| | | | | |
|---|---|---|---|---|
| 2013/0256638 A1* | 10/2013 | Uesugi | ............... | H01L 27/3276 438/34 |
| 2016/0035813 A1* | 2/2016 | Lee | .................... | H01L 51/5228 438/23 |

FOREIGN PATENT DOCUMENTS

| | | |
|---|---|---|
| KR | 1020170026014 A | 3/2017 |
| KR | 101994858 A | 7/2019 |

\* cited by examiner

DISPLAY APPARATUS COMPRISING A FIRST AUXILIARY WIRING LAYER HAVING A FIRST TIP PROTRUDING FROM A FIRST SIDE SURFACE OF AN ORGANIC INSULATING LAYER This application claims priority to Korean Patent Application No. 10-2020-0083672, filed on Jul. 7, 2020, and all the benefits accruing therefrom under 35 U.S.C. § 119, the content of which in its entirety is herein incorporated by reference.

BACKGROUND

1. Field

One or more embodiments relate to a display apparatus, and more particularly, to a display apparatus capable of realizing a high resolution and obtaining a high aperture ratio of a pixel.

2. Description of Related Art

With the development of a display apparatus for visually displaying electrical signals, various display apparatuses with excellent characteristics, such as a small thickness, a less weight, a reduced power consumption, etc., have been introduced. Recently, a flexible display apparatus that is foldable or rollable has been researched and developed, and further, a stretchable display apparatus that is changeable into various shapes has been actively researched and developed.

SUMMARY

One or more embodiments include a display apparatus, a shape of which is changeable, and which has a high resolution and an increased aperture ratio of a pixel. However, these features are examples and do not limit the scope of the disclosure.

Additional aspects will be set forth in part in the description which follows and, in part, will be apparent from the description, or may be learned by practice of the presented embodiments of the disclosure.

According to one or more embodiments, a display apparatus includes a substrate including a base portion and a plurality of connection portions, where the plurality of connection portions extends from the base portion in different directions from each other; a pixel circuit arranged on the base portion and including a thin-film transistor and a storage capacitor; an organic insulating layer on the pixel circuit; a pixel electrode arranged on the organic insulating layer and electrically connected to the pixel circuit; a first auxiliary wiring layer arranged on the organic insulating layer; an opposite electrode overlapping the pixel electrode in a plan view; and an emission layer between the pixel electrode and the opposite electrode. The organic insulating layer defines a first recess portion, the first auxiliary wiring layer has a first tip protruding from a first side surface of the organic insulating layer in a width direction of the first auxiliary wiring layer, and the first side surface defines the first recess portion.

The first auxiliary wiring layer may include a same material as the pixel electrode.

The first auxiliary wiring layer may have a closed-loop shape to surround an entirety of the pixel electrode in the plan view.

The opposite electrode may contact a portion of the first auxiliary wiring layer.

The display apparatus may further include a pixel-defining layer arranged on the pixel electrode and defining an opening overlapping the pixel electrode in the plan view, where the pixel-defining layer may cover a part of the first auxiliary wiring layer such that the portion of the first auxiliary wiring layer is exposed.

The opposite electrode may contact the portion of the first auxiliary wiring layer above the first tip.

The display apparatus may further include a common power line arranged on the substrate, where the first auxiliary wiring layer may be electrically connected to the common power line.

The common power line may include a first portion located on the base portion, and a second portion extending from the first portion toward at least one of the plurality of connection portions.

The opposite electrode may include portions separated by the first tip.

The display apparatus may further include a functional layer between the pixel electrode and the opposite electrode, where the functional layer may include portions separated by the first tip.

The display apparatus may further include an inorganic insulating layer arranged between the organic insulating layer and the pixel electrode.

The inorganic insulating layer may include a portion protruding from the first side surface of the organic insulating layer in the width direction of the first auxiliary wiring layer, and the portion of the inorganic insulation layer may be arranged below the first tip.

The display apparatus may further include an encapsulation layer covering the opposite electrode and including at least one inorganic encapsulation layer and at least one organic encapsulation layer.

The display apparatus may further include a second auxiliary wiring layer apart from the first auxiliary wiring layer.

The second auxiliary wiring layer may include a same material as the pixel electrode and the first auxiliary wiring layer.

The organic insulating layer may further define a second recess portion recessed in an opposite direction to the first recess portion.

The second auxiliary wiring layer may include a second tip facing the first tip of the first auxiliary wiring layer and protruding from a second side surface of the organic insulating layer, and the side surface may define the second recess portion.

The display apparatus may further include a spacer arranged above the second auxiliary wiring layer and surrounding an entirety of the base portion in the plan view.

The display apparatus may further include an encapsulation layer covering the opposite electrode and including at least one inorganic encapsulation layer and at least one organic encapsulation layer.

A portion of the at least one organic encapsulation layer may be arranged in the first recess portion.

These general and specific embodiments may be implemented by using a system, a method, a computer program, or a combination of the system, the method, and the computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
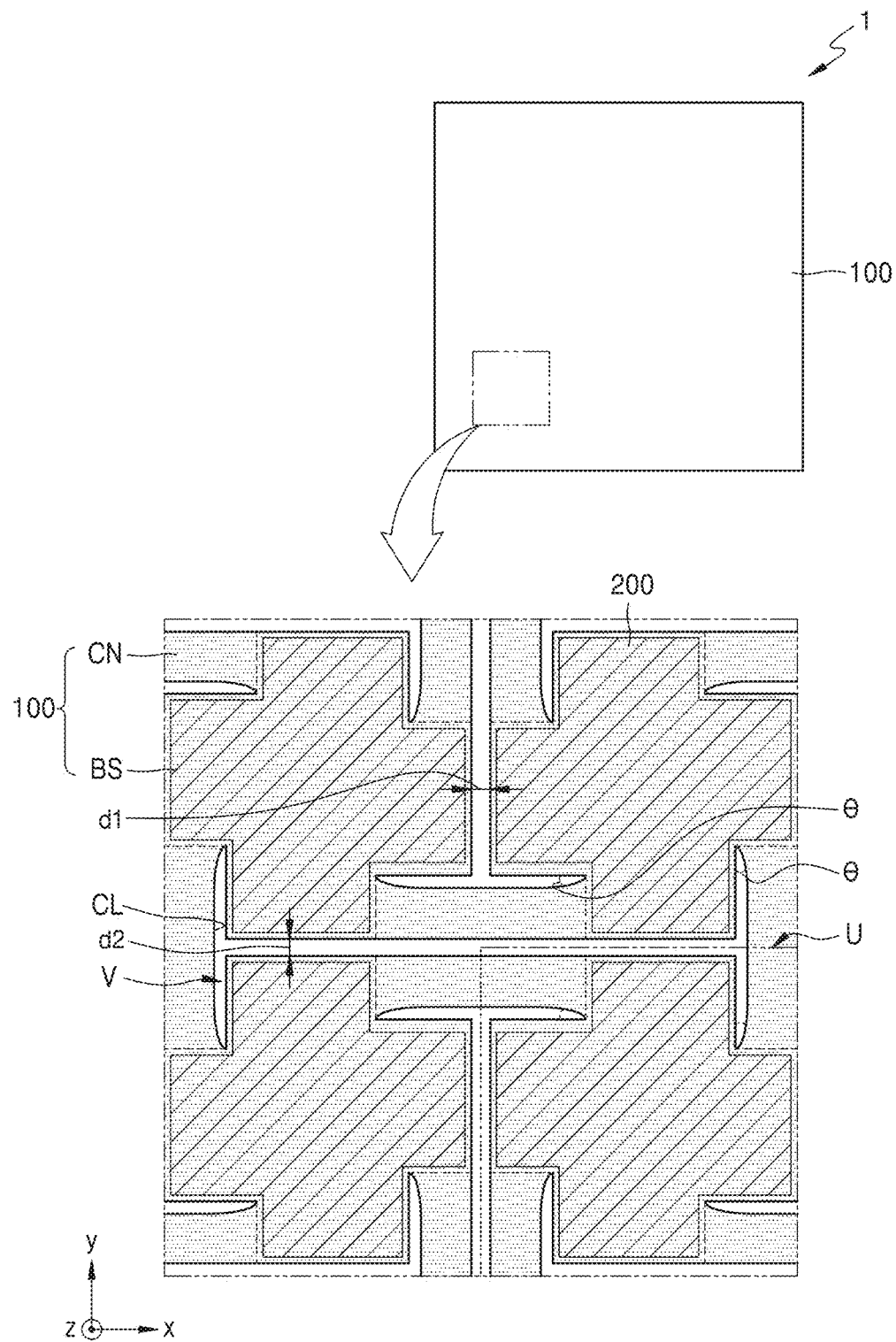
FIG. 1 is a schematic plan view of a display apparatus according to an embodiment.

Reference will now be made in detail to embodiments, examples of which are illustrated in the accompanying drawings, where like reference numerals refer to like elements throughout. In this regard, the present embodiments may have different forms and should not be construed as being limited to the descriptions set forth herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" may indicate A, B, or A and B. Also, the expression "at least one of A and B" may indicate A, B, or A and B.

In the embodiments hereinafter, it will be understood that when an element, an area, or a layer is referred to as being connected to another element, area, or layer, it can be directly and/or indirectly connected to the other element, area, or layer. For example, it will be understood in this specification that when an element, an area, or a layer is referred to as being in contact with or being electrically connected to another element, area, or layer, it can be directly and/or indirectly in contact with or electrically connected to the other element, area, or layer.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
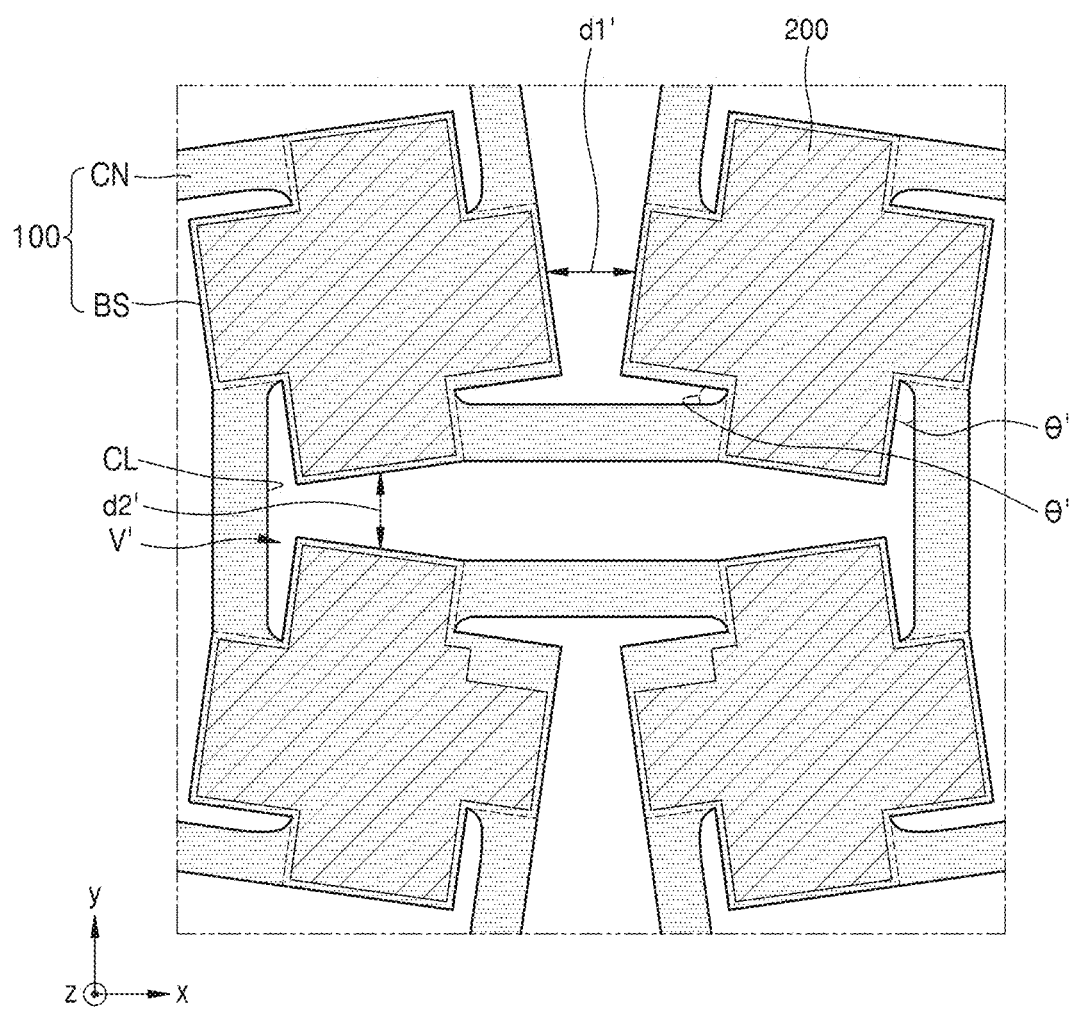
FIG. 2 is a schematic plan view of an enlarged portion of the display apparatus of FIG. 1.

FIG. 1 is a schematic plan view of a display apparatus 1 according to an embodiment, and FIG. 2 is a schematic plan view of an enlarged portion of the display apparatus 1 of FIG. 1.

Referring to FIGS. 1 and 2, the display apparatus 1 may include a substrate 100 and a display unit 200 arranged on the substrate 100.

The substrate 100 may include various materials, such as glass, metal, or organic materials. According to an embodiment, the substrate 100 may include flexible materials. For example, the substrate 100 may include ultra-thin flexible glass (for example, having a thickness of about dozens to about hundreds of micrometers) or polymer resins. When the substrate 100 includes polymer resins, the substrate 100 may include polyimide ("PI"). Alternatively, the substrate 100 may include polyethersulfone ("PES"), polyarylate, polyether imide ("PEI"), polyethylene naphthalate ("PEN"), polyethylene terephthalate ("PET"), polyphenylene sulfide ("PPS"), polycarbonate ("PC"), cellulose tri-acetate ("TAC"), and/or cellulose acetate propionate ("CAP").

The substrate 100 may include a plurality of base portions BS apart from each other, and a plurality of connection portions CN connecting the plurality of base portions BS with each other. A plurality of space areas V may be defined by the plurality of connection portions CN and plurality of base portions BS and penetrate the substrate 100.

The plurality of base portions BS may be arranged to be apart from each other. For example, the plurality of base portions BS may form a planar grid pattern in which the base portions BS are repeatedly arranged in a first direction (an x direction) and a second direction (a y direction). The second direction is different from the first direction (the x direction). According to an embodiment, the first direction (the x direction) and the second direction (the y direction) may intersect with each other. According to another embodiment, the first direction (the x direction) and the second direction (the y direction) may form an obtuse angle or an acute angle.

The display unit 200 may be arranged on the plurality of base portions BS. Light of a visible wavelength range may be emitted by an emission element of the display unit 200, and the light emitted by the emission element may be provided through an emission area, which corresponds to a flat region having a certain area. The emission area may be defined as a pixel. For example, a red pixel, a green pixel, and/or a blue pixel may be arranged on each base portion BS.

The plurality of connection portions CN may provide connection between the base portions BS that are adjacent to each other. For example, four connection portions CN may be connected to each base portion BS. The four connection portions CN connected to each base portion BS may extend in different directions from one another. Also, each of the four connection portions CN may connect two adjacent base portions BS. For example, one base portion BS may be connected to four base portions BS surrounding the base portion BS, through the four connection portions CN connected to the four surrounding base portions BS, respectively.

The plurality of base portions BS and the plurality of connection portions CN may be continually formed by including the same material. That is, the plurality of base portions BS and the plurality of connection portions CN may be integrally formed as a single body.

Hereinafter, for convenience of explanation, one base portion BS and the connection portions CN connected thereto may be referred to as a basic unit U, based on which a structure of the display apparatus 1 is to be described in more detail. The basic unit U may be repeatedly arranged in the first direction and the second direction, and it may be understood that the display apparatus 1 includes basic units U that are repeatedly arranged and connected to one another. Two basic units U that are adjacent to each other may be symmetrical with respect to each other. For example, the two basic units U adjacent to each other in a horizontal direction (i.e., x direction) in FIG. 1 may be horizontally symmetrical with respect to a symmetrical axis that is between the two basic units U and parallel with the y direction. Similarly, the two basic units U adjacent to each other in a vertical direction (i.e., y direction) in FIG. 1 may be vertically symmetrical with respect to a symmetrical axis that is between the two basic units U and parallel with the x direction.

The basic units U, which are adjacent to each other, for example, four basic units U illustrated in FIG. 1, may form a closed curve CL therebetween. The closed curve CL may define the space area V, which is an empty space. For example, the space area V may be defined by the closed curve CL including edges of the plurality of base portions BS and edges of the plurality of connection portions CN.

Each of the space areas V may penetrate an upper surface and a lower surface of the substrate 100. Each space area V may provide a space area between the plurality of base portions BS, and may reduce a weight of the display apparatus 1 and increase the flexibility of the display apparatus 1. Also, when an external force (a force of bending, warping, pulling, or pressing, etc.) is applied to the display apparatus 1, shapes of the space areas V may be changed so that stress, which may occur along with a change in the display apparatus 1, may be easily reduced in order to prevent abnormal deformation of the display apparatus 1 and increase the durability of the display apparatus 1. By doing so, user convenience of using the display apparatus 1 may be improved, and the display apparatus 1 may be conveniently applied to a wearable device.

The space areas V may be formed by removing regions of the substrate 100 by etching, etc., and as another example, the space areas V may be formed when the substrate 100 is manufactured. Examples of forming the space areas V as a component of the substrate 100 may vary, and manufacturing methods thereof are not limited to particular examples.

An angle θ between an edge of the base portion BS and an edge of the connection portion CN, may correspond to an acute angle. Here, the base portion BS and the connection portion CN are included in one basic unit U. When an external force, for example, a force of pulling the display apparatus 1, is applied, the angle θ between the edge of the base portion BS and the edge of the connecting portion CN may be increased to an angle θ' (θ'>θ) as shown in FIG. 2. Also, the space area V may be changed to a space area V' with a changed area or shape, and a location of the base portion BS may be changed. FIG. 2 is a plan view showing the display apparatus 1 in a state that the display apparatus 1 is stretched in the first direction (the x direction) and the second direction (the y direction). FIG. 2 shows that, when the described force is applied to the display apparatus 1, each base portion BS may rotate at a certain angle such that the angle between the base portion BS and the connection portion CN may be changed to angle θ', and an area of the space area V' may increase and/or a shape of the space area V may be changed. Due to the rotation of each base portion BS, distances between the base portions BS, for example, a first distance d1' and a second distance d2' as shown in FIG. 2, may be changed according to locations of measure.

When the force of pulling the display apparatus 1 is applied, stress may be concentrated in the connection portion CN connected to the edge of the base portion BS. Thus, in order to prevent damage to the display apparatus 1, the closed curve CL defining the space area V may include a curved line.

In substantially the same manner, for example, when a force of pressing the display apparatus 1 is applied, the angle θ between the edge of the base portion BS and the edge of connection portion CN may be decreased, and an area or a shape of the space area V may be changed. In addition, a location of the base portion BS may be changed. As described above, the display apparatus 1 may have extension or contraction characteristics.

Figure 3:
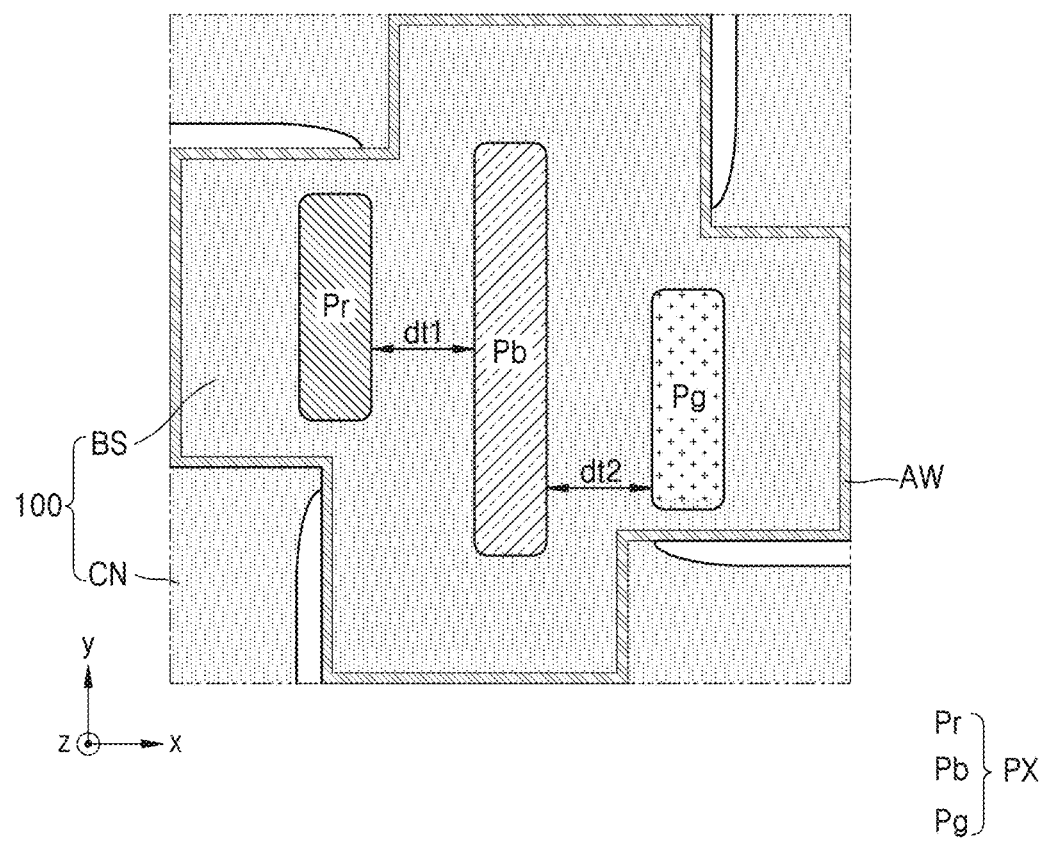
FIG. 3 is a schematic plan view of a structure of a basic unit of a display apparatus according to an embodiment.

FIG. 3 is a schematic plan view of a structure of a basic unit U of a display apparatus according to an embodiment.

Referring to FIG. 3, an emission element and a pixel circuit connected to the emission element may be arranged on each base portion BS. Also, an emission area, through which light of a visible wavelength is emitted by the emission element, may be located on the base portion BS.

The emission area may be defined as the pixel PX. The pixel PX may include a red sub-pixel Pr for emitting red light, a green sub-pixel Pg for emitting green light, and a blue sub-pixel Pb for emitting blue light.

In an embodiment, for example, the red sub-pixel Pr, the green sub-pixel Pg, or the blue sub-pixel Pb may be arranged on each base portion BS. As another example, all of the red sub-pixel Pr, the green sub-pixel Pg, and the blue sub-pixel Pb may be arranged on each base portion BS. Hereinafter, for convenience of description, a case where all of the red sub-pixel Pr, the green sub-pixel Pg, and the blue sub-pixel Pb are arranged on one base portion BS will be described.

The red sub-pixel Pr, the green sub-pixel Pg, and the blue sub-pixel Pb may be arranged in a direction to be apart from one another. For example, the red sub-pixel Pr, the green sub-pixel Pg, and the blue sub-pixel Pb may be arranged in a first direction (an x direction) to be apart from one another. Here, for example, distances (for example, a smallest distance in the first direction (the x direction) between adjacent sub-pixels) may be substantially the same. That is, a first distance dt1 between the red sub-pixel Pr and the blue sub-pixel Pb may substantially the same as a second distance dt2 between the blue sub-pixel Pb and the green sub-pixel Pg. As another example, the first distance dt1 and the second distance dt2 may be different from each other.

FIG. 3 illustrates that the sub-pixels are arranged as a stripe type. However, the sub-pixels according to the invention are not limited thereto and may be arranged as various types, such as an s-stripe type or a pentile type in another embodiment.

An auxiliary wiring layer AW may be arranged on the base portion BS. The auxiliary wiring layer AW may be arranged along the edge of each base portion BS. The auxiliary wiring layer AW may be continually formed to completely surround the pixel PX in a planar perspective (i.e., plan view). In other words, the auxiliary wiring layer AW may have a closed-loop shape to enclose the pixel PX in the plan view. A structure and a function of the auxiliary wiring layer AW will be described in detail, hereinafter, with reference to FIGS. 5 through 10.

With respect to FIGS. 4 through 10, a pixel and a sub-pixel may not be distinguished from each other and may be referred to as pixels for convenience of description except for a case where the distinction is particularly required.

Figure 4:
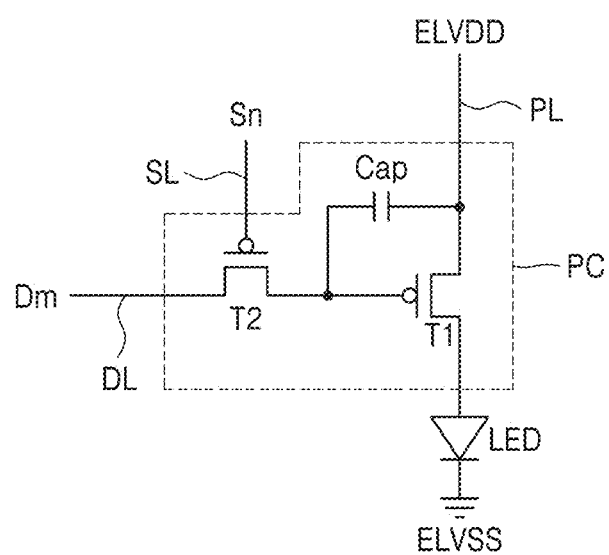
FIG. 4 is an equivalent circuit diagram of a pixel circuit of a display apparatus according to an embodiment.

FIG. 4 is an equivalent circuit diagram of a pixel circuit PC of the display apparatus 1 according to an embodiment.

Referring to FIG. 4, the display apparatus 1 may include the pixel circuit PC corresponding to each pixel PX (FIG. 3) and an emission element connected to the pixel circuit PC, where the emission element corresponds to a light-emitting diode LED. The light-emitting diode LED may emit light by receiving a driving current through the pixel circuit PC. For example, the light-emitting diode LED may emit red, green, or blue light.

The light-emitting diode LED may include an organic light-emitting diode ("OLED"), an inorganic light-emitting diode, or a quantum dot light-emitting diode. Hereinafter, for convenience, it will be described that the light-emitting diode LED of each pixel includes an OLED.

The pixel circuit PC may include a plurality of thin-film transistors and a storage capacitor Cap. According to an embodiment, as illustrated in FIG. 4, the pixel circuit PC may include a first thin-film transistor T1, a second thin-film transistor T2, and the storage capacitor Cap. For example, the first thin-film transistor T1 may include a driving thin-film transistor, and the second thin-film transistor T2 may include a switching thin-film transistor. The second thin-film transistor T2 may be connected to a scan line SL and a data line DL and may be configured to transmit a data signal Dm provided through the data line DL, to the first thin-film transistor T1, in response to a scan signal Sn provided through the scan line SL.

The storage capacitor Cap may be connected to the second thin-film transistor T2 and a driving voltage line PL and may be configured to storage a voltage corresponding to a difference between a first voltage ELVDD applied to the driving voltage line PL and a second voltage applied to the second thin-film transistor T2.

The first thin-film transistor T1 may be connected to the driving voltage line PL and the storage capacitor Cap and may be configured to control a driving current flowing from the driving voltage line PL through the OLED, according to the voltage value stored in the storage capacitor Cap. An opposite electrode of the OLED may be connected to a common voltage ELVSS. The OLED may display an image by emitting light having a certain brightness according to the driving current.

It is described with respect to FIG. 4 that the pixel circuit PC includes two thin-film transistors and one storage capacitor. However, the disclosure according to the invention is not limited thereto. In another embodiment, for example, the pixel circuit PC may include three or more thin-film transistors and/or two or more storage capacitors. According to an embodiment, the pixel circuit PC may include seven thin-film transistors and one storage capacitor. The number of thin-film transistors and the number of storage capacitors may be variously modified according to a design of the pixel circuit PC. However, hereinafter, for convenience of description, a case where the pixel circuit PC includes two thin-film transistors and one storage capacitor will be described.

Figure 5:
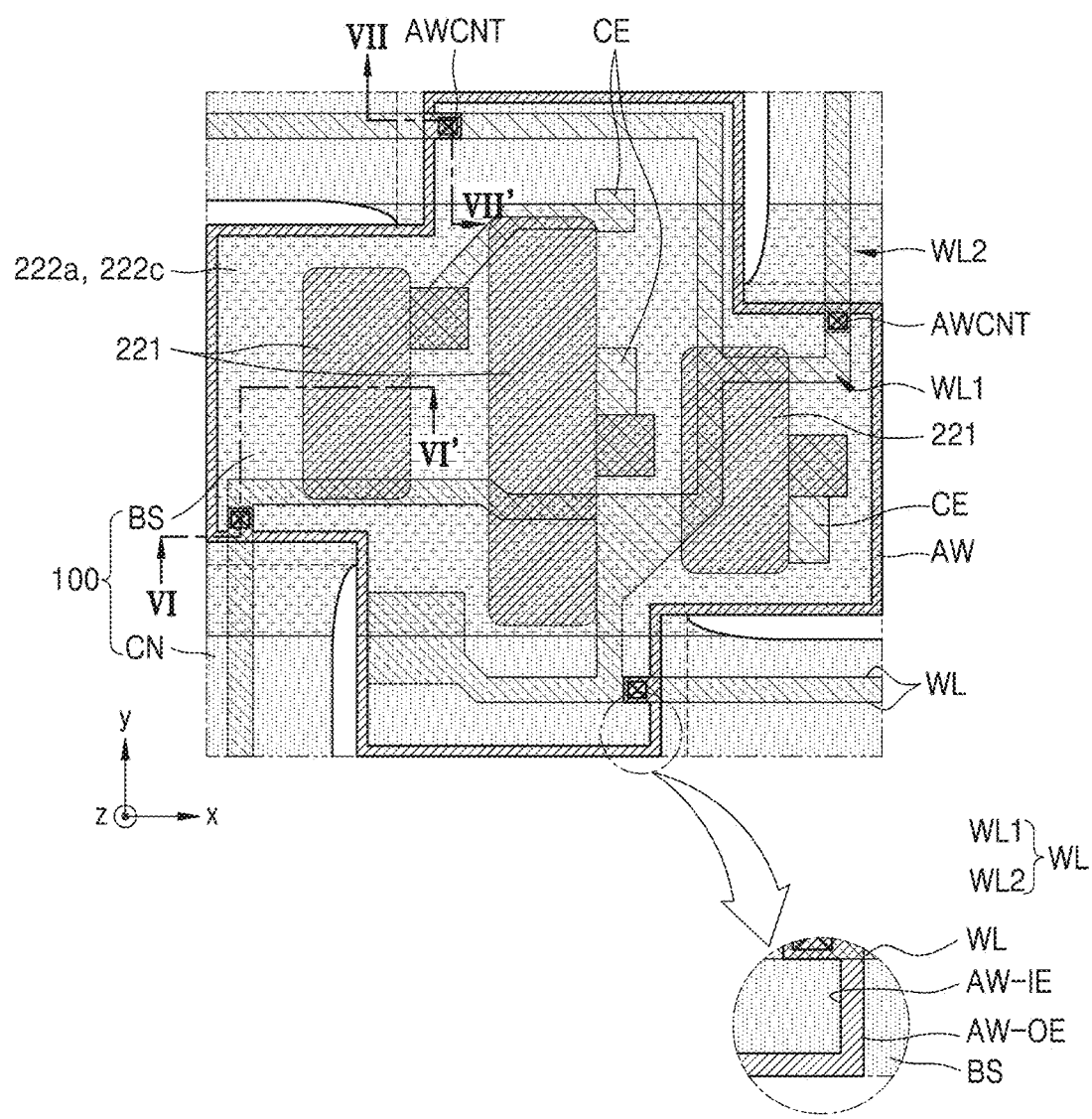
FIG. 5 is a schematic plan view of one or more layers of a display apparatus according to an embodiment.

FIG. 5 is a schematic plan view of one or more layers of a display apparatus according to an embodiment.

Referring to FIG. 5, a common power line WL, a pixel electrode 221, an auxiliary wiring layer AW, a first functional layer 222a, and a second functional layer 222c may be arranged on the substrate 100.

The common power line WL may be located on the base portion BS and the connection portion CN and may provide the common voltage ELVSS (FIG. 4). The common power line WL may include a first portion WL1 located on the base portion BS and a second portion WL2 extending from the first portion WL1 toward any one connection portion CN from among the plurality of connection portions CN. In an embodiment, the first portion WL1 and the second portion WL2 may be integrally formed as a single body in the same layer.

The pixel electrode 221 may be arranged on the base portion BS of the substrate 100. One pixel electrode 221 may correspond to one pixel PX. The pixel electrode 221 may be a portion of the light-emitting diode LED, as described below with reference to FIG. 6A. The pixel electrode 221 may be arranged above the common power line WL and may overlap a portion of the common power line WL in a plan view.

The pixel electrode 221 may be electrically connected to the first thin-film transistor T1 through a connection line CE and may receive a driving current. For example, the connection line CE may include the same material as the common power line WL and may be formed in the same layer as the common power line WL.

Planar areas of pixel electrodes 221 may be different from one another. For example, the pixel electrode 221 corresponding to a pixel PX for emitting blue light (i.e., blue sub-pixel Pb) may have a greater area than the pixel electrode 221 corresponding to a pixel PX for emitting red light (i.e., red sub-pixel Pr) or a pixel PX for emitting green light (i.e., green sub-pixel Pg). However, the pixel electrodes 221 corresponding to the pixels PX for emitting the same color of light may have the same area.

The auxiliary wiring layer AW may be arranged on the base portion BS of the substrate 100. The auxiliary wiring layer AW may be arranged along an edge of the base portion BS and may be continually formed to entirely surround the pixel electrode 221 in a planar perspective (i.e., in a plan view). In other words, the auxiliary wiring layer AW may have a closed-loop shape to enclose the pixel electrode 221 in the plan view. FIG. 5 illustrates that three pixel electrodes 221 are surrounded by the auxiliary wiring layer AW. However, the disclosure according to the invention is not limited thereto. According to the number of pixels arranged on the base portion BS, one or more, two or more, or four or more pixel electrodes 221 may be surrounded by the auxiliary wiring layer AW in another embodiment. The auxiliary wiring layer AW may be formed in the same layer and include the same material as the pixel electrode 221.

The auxiliary wiring layer AW may include an inner edge AW-IE toward an inner portion of the base portion BS and an outer edge AW_OE, the opposite edge to the inner edge AW_IE. According to an embodiment, as described below with reference to FIGS. 6A and 6B, the auxiliary wiring layer AW may include a tip PT (FIGS. 6A and 6B) protruding in a width direction of the auxiliary wiring layer AW toward an outer portion of the base portion BS. Here, the width direction refers a direction parallel to a plane defined by the first and second directions and perpendicular to the inner edge AW-IE and the outer edge AW-OE. The tip PT may be generally formed along the outer edge AW-OE.

A portion of the auxiliary wiring layer AW may be electrically connected to the common power line WL through a contact hole AWCNT. FIG. 5 illustrates four contact holes AWCNT. However, the disclosure according to the invention is not limited thereto.

The first functional layer 222a and the second functional layer 222c may be included in an intermediate layer 222 arranged above the pixel electrode 221. Unlike an emission layer 222b arranged for each pixel PX, the first and second functional layers 222a and 222c may be integrally formed to cover the plurality of pixels PX. For example, each of the first functional layer 222a and the second functional layer 222c may be integrally formed to cover the red, green, and blue sub-pixels Pr, Pg, and Pb (FIG. 3). The first and second functional layers 222a and 222c may be integrally formed throughout most areas of the base portion BS and one or more areas of the connection portion CN.

The first and second functional layers 222a and 222c may not be arranged in one or more areas of the base portion BS. For example, the first and second functional layers 222a and 222c may be partially arranged on the base portion BS such that the first and second functional layers 222a and 222c may entirely cover the pixel electrodes 221 while exposing at least one or more areas of the base portion BS, in which the pixel electrode 221 is not arranged. For example, the one or more areas may include areas of the base portion BS, and the areas may be adjacent to at least one edge of the base portion BS. Based on this structure, an opposite electrode 223 (FIG. 6A) arranged above the first and second functional layers 222a and 222c may contact the auxiliary wiring layer AW. This aspect will be described in detail below with reference to FIGS. 7A and 7B.

As a comparative example, an opposite electrode may be connected to the common power line WL through an additional contact hole in order to receive the common voltage ELVSS. A pixel PX may not be arranged in an area in which the additional contact hole is defined, and thus, an aperture ratio of the pixel PX may decrease. However, according to an embodiment of the disclosure, via the auxiliary wiring layer AW located along the edge of the base portion BS, the opposite electrode 223 may be electrically connected to the common power line WL. Thus, an additional contact hole may not have to be arranged on the base portion BS. Based on this structure, an area of the pixel electrodes 221 may be increased, to increase the aperture ratio of the pixel PX. Also, a patterning process for forming the additional contact hole may not be required, and the first functional layer 222a and the second functional layer 222c may be easily patterned.

Figure 6A:
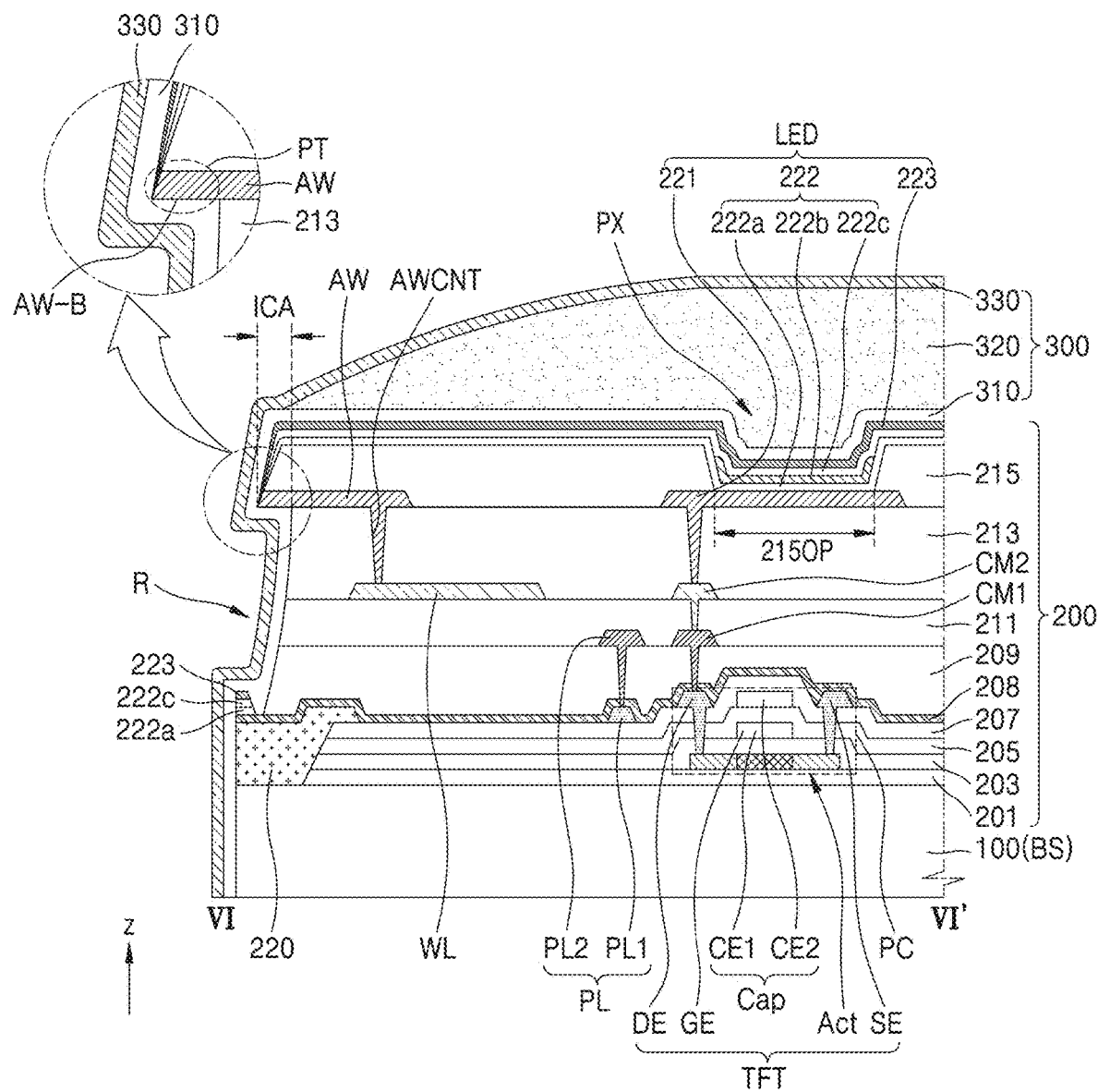
FIGS. 6A and 6B are cross-sectional views of a display apparatus taken along line VI-VI' of FIG. 5, according to embodiments.
Figure 6B:
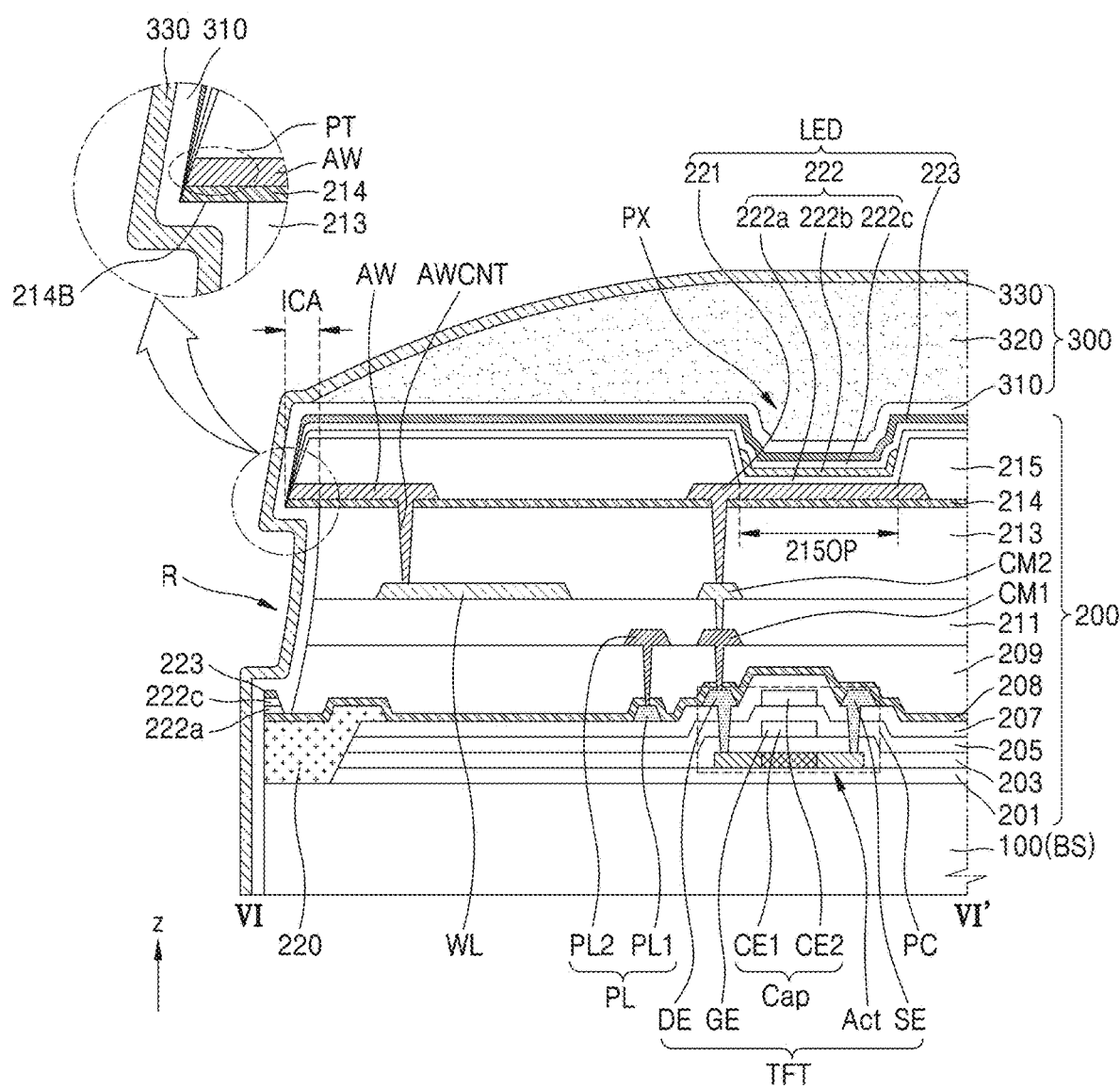

FIGS. 6A and 6B are cross-sectional views of a display apparatus taken along line VI-VI' of FIG. 5, according to embodiments.

First, referring to FIG. 6A, the pixel circuit PC and the light-emitting diode LED electrically connected to the pixel circuit PC may be arranged on the base portion BS of the substrate 100. As described with reference to FIG. 4, the pixel circuit PC may include the thin-film transistor TFT and the storage capacitor Cap.

A buffer layer 201 may be arranged between the substrate 100 and the pixel circuit PC and may prevent penetration of impurities into the thin-film transistor TFT. The buffer layer 201 may include an inorganic insulating material, such as silicon nitride, silicon oxynitride, and silicon oxide, and may include a single layer or multiple layers including the inorganic insulating materials described above.

The thin-film transistor TFT may include a semiconductor layer Act, a gate electrode GE that overlaps a channel area of the semiconductor layer Act in a plan view, and a source electrode SE and a drain electrode DE that are connected to a source area and a drain area of the semiconductor layer Act, respectively. FIG. 6A illustrates a top gate-type thin-film transistor TFT in which the gate electrode GE is arranged on the semiconductor layer Act with a gate insulating layer 203 therebetween. However, according to another embodiment, the thin-film transistor TFT may be a bottom gate-type thin-film transistor TFT.

The semiconductor layer Act may include polysilicon. In some embodiments, the semiconductor layer Act may include amorphous silicon. In some embodiments, the semiconductor layer Act may include an oxide of at least one material selected from the group consisting of In, Ga, Sn, Zr, V, Hf, Cd, G, Cr, Ti, and Zn. The semiconductor layer Act may include a channel area, and a source area and a drain area doped with impurities.

The gate electrode GE may include a low-resistance metal material. The gate electrode GE may include a conductive material including Mo, Al, Cu, Ti, etc. and may include multiple layers or a single layer including the conductive materials described above.

The gate insulating layer 203 between the semiconductor layer Act and the gate electrode GE may include an inorganic insulating material, such as silicon oxide, silicon nitride, silicon oxynitride, aluminum oxide, titanium oxide, tantalum oxide, and hafnium oxide. The gate insulating layer 203 may include a single layer or multiple layers including the materials described above.

The source electrode SE and the drain electrode DE may be located in the same layer, for example, on a second interlayer-insulating layer 207, and may include the same material as each other. The source electrode SE and the drain electrode DE may include a material having good conductivity. The source electrode SE and/or the drain electrode DE may include Al, Pt, Pd, Ag, Mg, Au, Ni, Nd, Ir, Cr, Ca, Mo, Ti, W, and/or Cu and may include a single layer or multiple layers including the materials described above. For example, the source electrode SE and/or the drain electrode DE may have a triple-layered structure including a titanium layer/an aluminum layer/a titanium layer.

The storage capacitor Cap may include a lower electrode CE1 and an upper electrode CE2 overlapping each other in a plan view with a first interlayer-insulating layer 205 therebetween. According to an embodiment, the storage capacitor Cap may overlap the thin-film transistor TFT, and the gate electrode GE of the thin-film transistor TFT may also function as the lower electrode CE1 of the storage capacitor Cap. According to another embodiment, the storage capacitor Cap may not overlap the thin-film transistor TFT in a plan view. The storage capacitor Cap may be covered by a second interlayer-insulating layer 207. The upper electrode CE2 of the storage capacitor Cap may include a conductive material including Mo, Al, Cu, Ti, etc. and may include multiple layers or a single layer including the materials described above.

The first interlayer-insulating layer 205 and the second interlayer-insulating layer 207 may be arranged on the gate insulating layer 203 and may include an inorganic insulating material, such as silicon oxide, silicon nitride, and silicon oxynitride. The first interlayer-insulating layer 205 and the second interlayer-insulating layer 207 may include a single layer or multiple layers including the materials described above.

Edges of the buffer layer 201, the gate insulating layer 203, the first interlayer-insulating layer 205, and the second interlayer-insulating layer 207 may be covered by an organic material layer 220. For example, the organic material layer 220 may cover the edges of the buffer layer 201, the gate insulating layer 203, the first interlayer-insulating layer 205, and the second interlayer-insulating layer 207 which have step differences with respect to an upper surface of the substrate 100. The organic material layer 220 may alleviate the stress of inorganic insulating material layers that contact one another at an edge portion of the substrate 100, and the edge portion may include, for example, an edge of the base portion BS. The organic material layer 220 may include an organic insulating material, such as PI, and a portion of the organic material layer 220 may be between the second interlayer-insulating layer 207 and a first inorganic insulating layer 208.

At least one organic insulating layer may be arranged on the pixel circuit PC. For example, a first organic insulating layer 209 and a second organic insulating layer 211 may be sequentially stacked on the pixel circuit PC. As another example, the first organic insulating layer 209, the second organic insulating layer 211, and a third organic insulating layer 213 may be sequentially stacked on the pixel circuit PC. Hereinafter, for convenience of description, a case where the first organic insulating layer 209, the second organic insulating layer 211, and the third organic insulating layer 213 are sequentially stacked on the pixel circuit PC will be described.

The first organic insulating layer 209, the second organic insulating layer 211, and the third organic insulating layer 213 may include an organic insulating material. The organic insulating material may include, for example, benzocyclobutene ("BOB"), PI, hexamethyldisiloxane ("HMDSO"), polymethylmethacrylate ("PMMA"), or a general-purpose polymer, such as polystyrene ("PS"), a polymer derivate having a phenol-based group, an acryl-based polymer, an imide-based polymer, an aryl ether based polymer, an amide-based polymer, a fluorine-based polymer, a p-xylene-based polymer, a vinyl alcohol-based polymer, or a blend thereof.

The thin-film transistor TFT and the storage capacitor Cap of the pixel circuit PC may be covered by the first organic insulating layer 209. Also, the first inorganic insulating layer 208 may be between the first organic insulating layer 209 and the second interlayer-insulating layer 207. The first inorganic insulating layer 208 may include an inorganic insulating layer including an inorganic insulating material, such as silicon nitride, silicon oxide, and silicon oxynitride.

The driving voltage line PL may include a lower driving voltage line PL1 and an upper driving voltage line PL2 electrically connected to each other with the first organic insulating layer 209 therebetween. The lower driving voltage line PL1 may be located in the same layer as the source electrode SE and the drain electrode DE and may include the same material as the source electrode SE and the drain electrode DE. When the driving voltage line PL has a multi-layered structure in which layers are connected to each other with an insulating layer therebetween, as described above, an increase in resistance of the driving voltage line PL may be prevented and a width of the driving voltage line PL may be reduced. According to another embodiment, the driving voltage line PL may include only one of the lower driving voltage line PL1 and the upper driving voltage line PL2.

The pixel electrode 221 may be arranged on the organic insulating layer, for example, the third organic insulating layer 213, and may be electrically connected to the thin-film transistor TFT of the pixel circuit PC. With respect to this aspect, FIG. 6A illustrates that the thin-film transistor TFT and the pixel electrode 221 are electrically connected to each other via a first contact metal CM1 on the first organic insulating layer 209 and a second contact metal CM2 on the second organic insulating layer 211.

The pixel electrode 221 may include transparent conductive oxide, such as indium tin oxide ("ITO"), indium zinc oxide ("IZO"), zinc oxide ("ZnO"), indium oxide ($In_2O_3$), indium gallium oxide ("IGO"), or aluminum zinc oxide ("AZO"). According to another embodiment, the pixel electrode 221 may include a reflective layer including Ag, Mg, Al, Pt, Pd, Au, Ni, Nd, Ir, Cr, or a compound thereof. According to another embodiment, the pixel electrode 221 may further include a layer including ITO, IZO, ZnO or $In_2O_3$ above/below the reflective layer described above. For example, the pixel electrode 221 may have a triple-layered structure in which an ITO layer, an Ag layer, and an ITO layer are stacked.

A pixel-defining layer 215 may be arranged on the pixel electrode 221. The pixel-defining layer 215 may cover an edge of the pixel electrode 221 and may define an opening 2150P overlapping a central portion of the pixel electrode 221 in a plan view. The pixel-defining layer 215 may increase a distance between the edge of the pixel electrode 221 and the opposite electrode 223 above the pixel electrode 221 so as to prevent arcs, etc. from occurring at the edge of the pixel electrode 221. The pixel-defining layer 215 may be formed by using a spin coating method, etc., by using an organic insulating material, such as PI, polyamide, acryl resins, BCB, HMDSO, phenol resins, etc.

The intermediate layer 222 may be arranged above the pixel-defining layer 215 to correspond to the pixel electrode 221. The intermediate layer 222 may be arranged between the pixel electrode 221 and the opposite electrode 223.

The intermediate layer 222 may include an emission layer 222b. The emission layer 222b may include an organic emission material, such as a high molecular-weight organic material or a low molecular-weight organic material, which emit a certain color of light. Alternatively, the emission layer 222b may include an inorganic emission material or quantum dots.

The first functional layer 222a and the second functional layer 222c may be arranged above and below the emission layer 222b, respectively. The first functional layer 222a may include a single layer or multiple layers. For example, the first functional layer 222a may include a hole transport layer ("HTL") having a single-layered structure and may include poly-(3,4)-ethylene-dihydroxy thiophene ("PEDOT") or polyaniline ("PANI"). Alternatively, the first functional layer 222a may include a hole injection layer ("HIL") and an HTL. The second functional layer 222c may include a single layer or multiple layers. The second functional layer 222c may include an electron transport layer ("ETL") and/or an electron injection layer ("EIL").

FIG. 6A illustrates that the intermediate layer 222 includes both of the first functional layer 222a and the second functional layer 222c. However, according to another embodiment, the intermediate layer 222 may selectively include one of the first functional layer 222a and the second functional layer 222c. For example, the intermediate layer 222 may not include the second functional layer 222c.

While the emission layer 222b of the intermediate layer 222 may be arranged for each pixel, the first and second functional layers 222a and 222c may be integrally formed to cover the plurality of pixels. For example, each of the first functional layer 222a and the second functional layer 222c may be integrally formed to cover the red, green, and blue sub-pixel Pr, Pg, and Pb (FIG. 3).

The opposite electrode 223 may be arranged on the pixel electrode 221 and may overlap the pixel electrode 221 in a plan view. The opposite electrode 223 may include a conductive material having a low work function. For example, the opposite electrode 223 may include a (semi-) transparent layer including Ag, Mg, Al, Pt, Pd, Au, Ni, Nd, Ir, Cr, Li, Ca, or an alloy thereof. Alternatively, the opposite electrode 223 may further include a layer, such as ITO, IZO, ZnO, or $In_2O_3$, on the (semi-) transparent layer including the above-mentioned materials. The opposite electrode 223 may be integrally formed to cover the plurality of pixels, for example, the red, green, and blue sub-pixels Pr, Pg, and Pb (FIG. 3). For example, the opposite electrode 223 may cover the entirety of the base portion BS of the substrate 100. An area of the opposite electrode 223 may be different from an area of the first functional layer 222a or an area of the second functional layer 222c described above.

The light-emitting diode LED may include a structure in which the pixel electrode 210, the intermediate layer 222, and the opposite electrode 230 are stacked. The light-emitting diode LED may emit red, green, or blue light, and an emission area of each light-emitting diode LED may correspond to a pixel PX. Because the opening 2150P of the pixel-defining layer 215 may define a size and/or a width of an emission area, a size and/or a width of a pixel PX may be dependent upon a size and/or a width of the opening 2150P defined in the pixel-defining layer 215 corresponding to the pixel PX.

The structure of the light-emitting diode LED illustrated in FIGS. 6A and B may be likewise applied to the pixels PX emitting different colors of light. However, because the colors of light emitted by the emission layers provided in the pixels PX are different from one another, specific materials of the emission layers of the pixels PX may be different from one another.

A capping layer (not shown) may be formed on the opposite electrode 223. The capping layer may include LiF. Alternatively, the capping layer may include an inorganic insulating material, such as silicon nitride, and/or an organic insulating material. In some embodiments, the capping layer may be omitted.

An upper portion of the opposite electrode 223 may be covered by an encapsulation layer 300. The encapsulation layer 300 may include at least one inorganic encapsulation layer and at least one organic encapsulation layer. According to an embodiment, the encapsulation layer 300 may include a first inorganic encapsulation layer 310, an organic encapsulation layer 320, and a second inorganic encapsulation layer 330 that are sequentially stacked.

Each of the first and second inorganic encapsulation layers 310 and 330 may include one or more inorganic insulating materials. The inorganic insulating materials may include aluminum oxide, tantalum oxide, hafnium oxide, zinc oxide, silicon oxide, silicon nitride, and/or silicon oxynitride. The first and second inorganic encapsulation layers 310 and 330 may be formed by chemical vapor deposition ("CVD").

The organic encapsulation layer 320 may include a polymer-based material. Examples of the polymer-based material may include an acrylic resin, an epoxy resin, polyimide, and/or polyethylene. The acrylic resin may include, for example, polymethylmethacrylate, polyacrylic acid, etc. The organic encapsulation layer 320 may be formed by curing a monomer or coating a polymer. The organic encapsulation layer 320 may be transparent. The organic encapsulation layer 320 may be located only on each base portion BS. Thus, the display apparatus 1 may include the organic encapsulation layers 320 arranged on the base portions BS to be apart from each other.

The auxiliary wiring layer AW may be arranged in the same layer as the pixel electrode 221. The auxiliary wiring layer AW may be arranged on the organic insulating layer, for example, the third organic insulating layer 213. The auxiliary wiring layer AW may include the same material as the pixel electrode 221.

A portion of the auxiliary wiring layer AW may extend in a horizontal direction (or a width direction of the auxiliary wiring layer AW), which is parallel with an upper surface of the substrate 100, and may protrude, in the horizontal direction, further from a side surface of the organic insulating layer arranged right below the auxiliary wiring layer AW, for example, the third organic insulating layer 213, to form the tip PT. A recess portion R, which is a sunken space, may be defined below the tip PT, and a depth of the recess portion R may be sufficiently great at least to penetrate the third organic insulating layer 213. According to an embodiment, as illustrated in FIG. 6A, the depth of the recess portion R may be substantially the same as thicknesses of the third organic insulating layer 213, the second organic insulating layer 211, and the first organic insulating layer 209. Here, the depth of the recess portion R may be defined as a length of the recess portion R in the thickness direction (i.e., z direction)

The recess portion R may be formed when a portion of the organic insulating layer arranged below the auxiliary wiring layer AW is removed. For example, the recess portion R may be formed by removing an edge portion of the third organic insulating layer 213. According to an embodiment, FIG. 6A illustrates that the recess portion R is defined by removing edge portions of the third organic insulating layer 213, the second organic insulating layer 211, and the first organic insulating layer 209. In this case, the recess portion R may be defined by side surfaces of the third organic insulating layer 213, the second organic insulating layer 211, and the first organic insulating layer 209.

The recess portion R may be formed by removing the edge portions of the third organic insulating layer 213, the second organic insulating layer 211, and the first organic insulating layer 209 described above via etching. Here, the first inorganic insulating layer 208 arranged below the first organic insulating layer 209 may function as an etch stopper. In this case, an upper surface of the first inorganic insulating layer 208 may correspond to a bottom surface of the recess portion R. An end of the auxiliary wiring layer AW, for example, the tip PT, may protrude from the side surfaces of the third organic insulating layer 213, the second organic insulating layer 211, and the first organic insulating layer 209 in the horizontal direction. That is, the tip PT may protrude from the pixel electrode 221 in the width direction of the auxiliary wiring layer AW.

Due to an overhang structure (or an eaves structure or an undercut structure) formed by the end of the auxiliary wiring layer AW, where the end protrudes from the side surface of the third organic insulating layer 213, at least one organic material layer provided in the intermediate layer 222, for example, the first functional layer 222a and/or the second functional layer 222c, may be disconnected or separated, respectively. The overhang structure described above may be formed before the intermediate layer 222 is formed. Due to the overhang structure, the organic material layers of the light-emitting diode LED integrally formed to cover the plurality of pixels PX, for example, the first functional layer 222a and the second functional layer 222c, may be disconnected or separated with respect to the tip PT. With respect to this aspect, FIG. 6A illustrates that each of the first functional layer 222a and the second functional layer 222c is separated by the tip PT and is spaced apart from each other. For example, while most portions of each of the first functional layer 222a and the second functional layer 222c may be located on the pixel-defining layer 215, one or more portions of each of the first and second functional layers 222a and 222c may remain on a portion of the auxiliary wiring layer AW and/or a bottom surface of the recess portion R formed below the tip PT, for example, the first inorganic insulating layer 208.

Similarly, the opposite electrode 223 may be disconnected or separated due to the overhang structure. With respect to this aspect, FIG. 6A illustrates that the opposite electrode 223 is separated based on the tip PT. While most portions of the opposite electrode 223 may be located on the pixel-defining layer 215, an edge portion of the opposite electrode 223 may remain on a portion of the auxiliary wiring layer AW and/or the bottom surface of the recess portion R formed below the tip PT, for example, the first inorganic insulating layer 208.

A bottom surface AW-B of the end of the auxiliary wiring layer AW, the end forming the overhang structure, for example, a bottom surface AW-B of the tip PT, may directly contact at least one inorganic encapsulation layer included in the encapsulation layer 300. That is, the first inorganic encapsulation layer 310 of the encapsulation layer 300 may directly contact the bottom surface AW-B of the tip PT of the auxiliary wiring layer AW such that an inorganic contact area ICA may be formed. The inorganic contact area ICA may prevent external moisture from penetrating into the light-emitting diode LED provided in each pixel PX.

As described above with reference to FIG. 3, the auxiliary wiring layer AW may extend along the edge of the base portion BS and may be continually formed to entirely surround the pixels PX in a planar perspective (or when viewed in a direction perpendicular to an upper surface of the substrate). In other words, the auxiliary wiring layer AW may have a closed-loop shape to enclose the pixels in the plan view. Also, the tip PT of the auxiliary wiring layer AW may be generally formed along the outer edge AW-OE (FIG. 3) of the auxiliary wiring layer AW. The inorganic contact area ICA may be formed by the tip PT of the auxiliary wiring layer AW, the tip PT contacting the first inorganic encapsulation layer 310. Thus, in the planar perspective (i.e., in a plan view), the inorganic contact area ICA may also extend to entirely surround the pixels PX, and the pixels PX may be arranged in the inorganic contact area ICA. A width of the inorganic contact area ICA may be dependent on a width of the tip PT of the auxiliary wiring layer AW.

Unlike the first functional layer 222a, the second functional layer 222c, and the opposite electrode 223, the first inorganic encapsulation layer 310 formed by CVD may have relatively excellent step coverage, and thus, may be formed also on the bottom surface AW-B of the tip PT. The first inorganic encapsulation layer 310 may extend in a downward direction from an upper portion of the opposite electrode 223 toward the substrate 100. Also, the first inorganic encapsulation layer 310 may continually extend to cover the bottom surface AW-B of the tip PT, the side surfaces of the first through third organic insulating layers 209, 211, and 213, and a side surface of the substrate 100.

Like the first inorganic encapsulation layer 310, the second inorganic encapsulation layer 330 may continually extend to cover an upper surface of the organic encapsulation layer 320 and the side surface of the substrate 100. Thus, water penetration in a lateral direction of the display apparatus, for example, through the side surface of the organic material layer 220 and the side surfaces of the first through third organic insulating layers 209, 211, and 213, may be prevented.

The overhang structure based on the tip PT of the auxiliary wiring layer AW may disconnect or separate the first functional layer 222a, the second functional layer 222c, and the opposite electrode 223. Also, the first and second inorganic encapsulation layers 310 and 330 and the tip PT may form the inorganic contact area ICA. Thus, water penetration may be prevented. Based on this structure, there is no need to form an additional inorganic contact area, and an available area is increased. Thus, a display apparatus that is highly integrated and has a high resolution may be realized.

The common power line WL may be arranged on the substrate 100. According to an embodiment, the common power line WL may be arranged on the second organic insulating layer 211. In this case, the auxiliary wiring layer AW may be electrically connected to the common power line WL through the contact hole AWCNT defined in the third organic insulating layer 213 arranged on the common power line WL. According to another embodiment, the common power line WL may be arranged on the first organic insulating layer 209. In this case, the auxiliary wiring layer AW may be electrically connected to the common power line WL through a contact hole defined in the third organic insulating layer 213 and the second organic insulating layer 211. As described above, the auxiliary wiring layer AW may be electrically connected to the common power line WL and may receive a common voltage ELVSS from the common power line WL.

FIG. 6B is a cross-sectional view of a display apparatus according to another embodiment. Components of FIG. 6B that are the same as the components of FIG. 6A will not be described, and different aspects will be mainly described.

Referring to FIG. 6B, a third inorganic insulating layer 214 may be arranged between an organic insulating layer (for example, the third organic insulating layer 213) and the pixel electrode 221. The third inorganic insulating layer 214 may include an inorganic insulating material, such as silicon nitride, silicon oxide, and silicon oxynitride.

The third inorganic insulating layer 214 may include a protruding portion extending in a horizontal direction (or a width direction of the auxiliary wiring layer AW) to protrude further from a side surface of the third organic insulating layer 213 defining the recess portion R. The protruding portion of the third inorganic insulating layer 214 may be arranged below the tip PT of the auxiliary wiring layer AW. In this case, an upper surface of the recess portion R may correspond to a bottom surface 214B of the third inorganic insulating layer 214, and the protruding portion of the third inorganic insulating layer 214 and the tip PT of the auxiliary wiring layer AW may form an overhang structure.

The bottom surface 214B of the protruding portion of the third inorganic insulating layer 214 may directly contact at least one inorganic encapsulation layer provided in the encapsulation layer 300. For example, when the first inorganic encapsulation layer 310 of the encapsulation layer 300 directly contacts the bottom surface 214B of the protruding portion of the third inorganic insulating layer 214 including an inorganic insulating material, the inorganic contact area ICA may be formed. Because both of the first inorganic encapsulation layer 310 and the third inorganic insulating layer 214 may include inorganic insulating materials, the rigidity of the contact of the first inorganic encapsulation layer 310 and the third inorganic insulating layer 214 may be improved.

The auxiliary wiring layer AW arranged on the third inorganic insulating layer 214 may be electrically connected to the common power line WL arranged on the second organic insulating layer 211, through the contact hole AWCNT defined in the third inorganic insulating layer 214 and the third organic insulating layer 213.

Figure 7A:
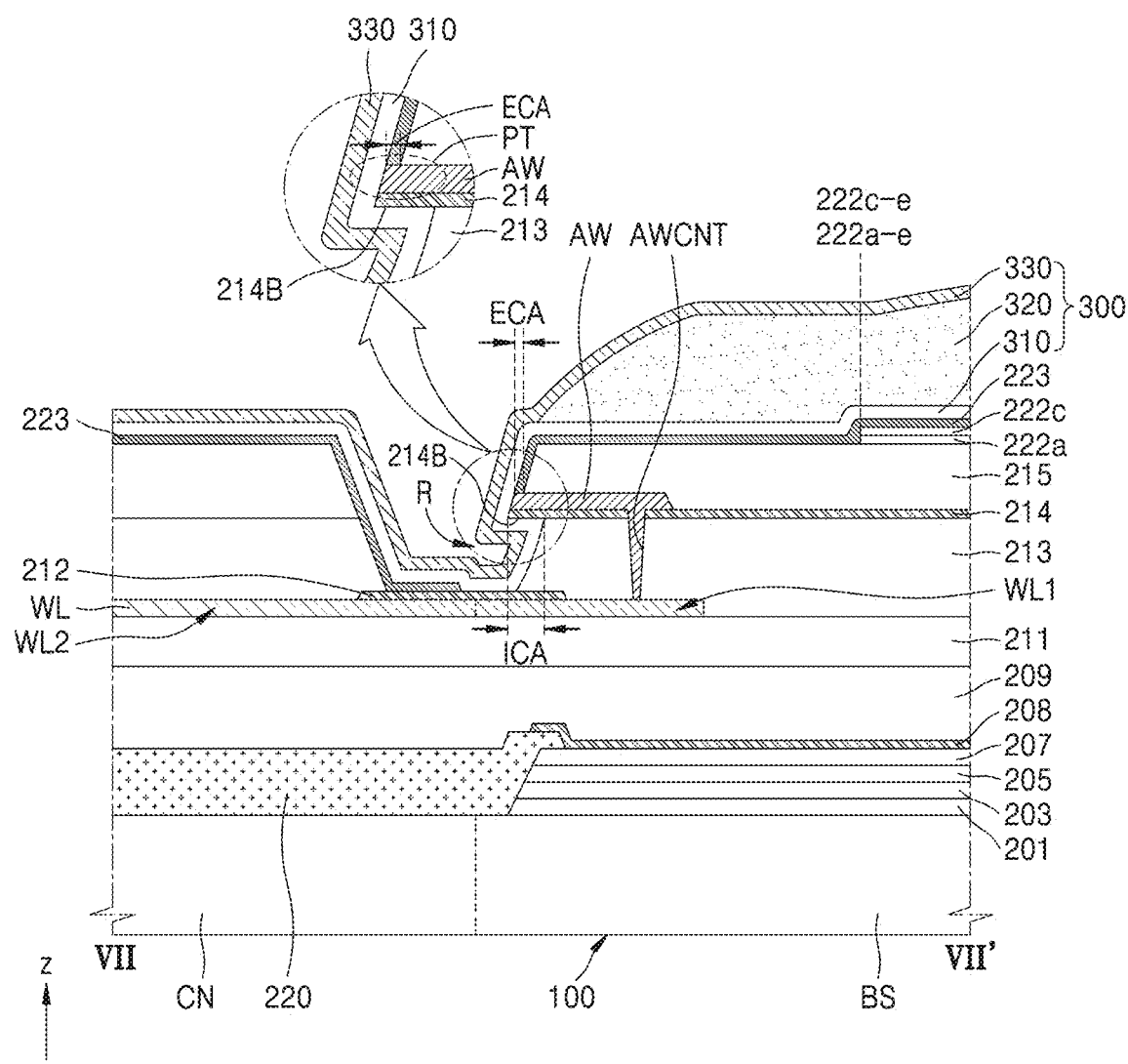
FIGS. 7A and 7B are cross-sectional views of a display apparatus taken along line VII-VII' of FIG. 5, according to embodiments.
Figure 7B:
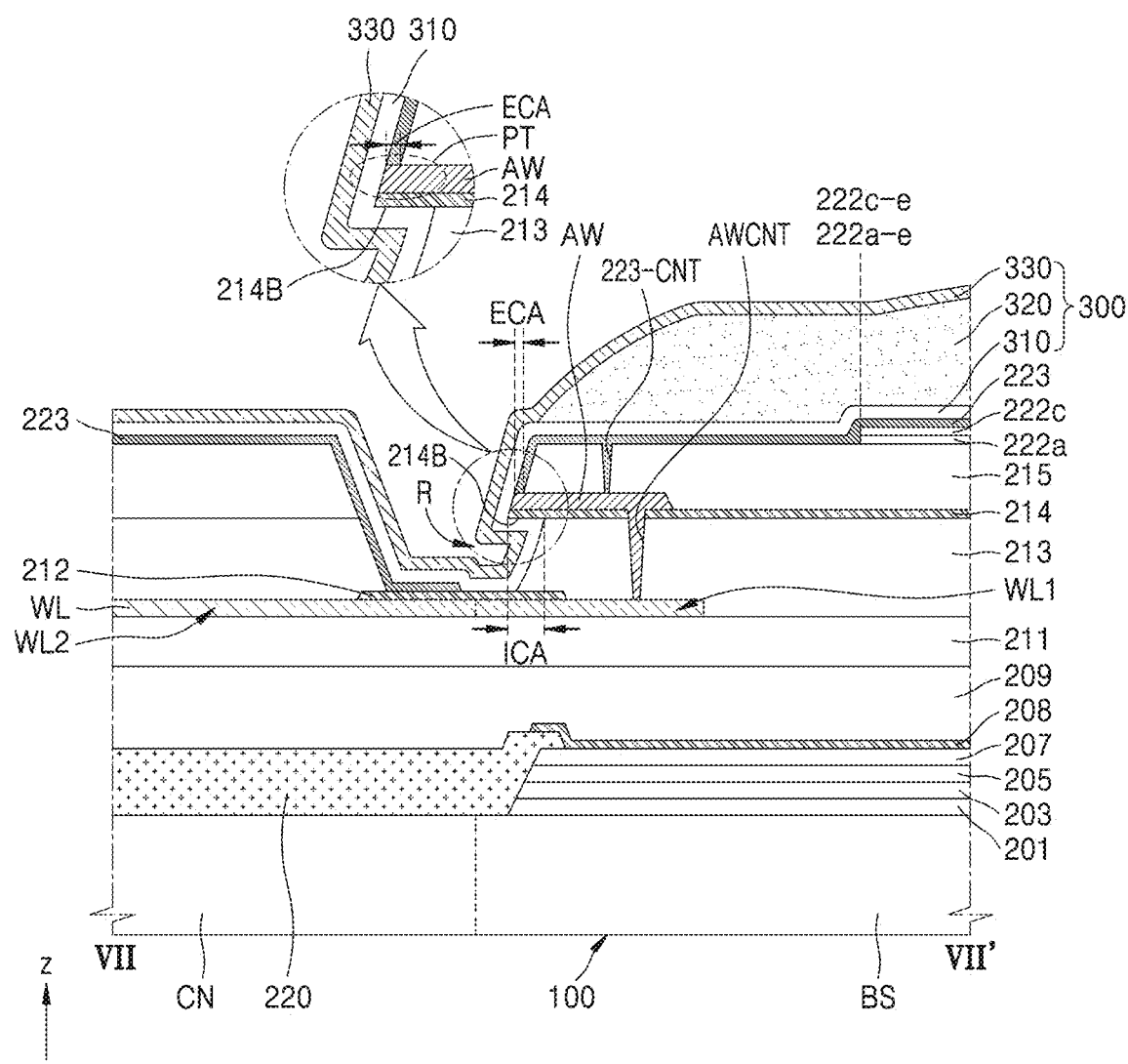

FIGS. 7A and 7B are cross-sectional views of the display apparatus taken along line VII-VII' of FIG. 5, according to embodiments.

Referring to FIG. 7A, the base portion BS and the connection portion CN of the substrate 100 may be integrally formed, and a structure of the base portion BS may correspond to the structure of the base portion BS described above with reference to FIG. 6A. An inorganic insulating layer on the base portion BS may not extend onto the connection portion CN. For example, edges of the buffer layer 201, the gate insulating layer 203, the first interlayer-insulating layer 205, and the second interlayer-insulating layer 207 may be located on the base portion BS and may be covered by the organic material layer 220. Similarly, the first inorganic insulating layer 208 and the third inorganic insulating layer 214 may not extend onto the connection portion CN.

The common power line WL may include the first portion WL1 located on the base portion BS and the second portion WL2 extending from the first portion WL1 onto the connection portion CN. As described below, the common power line WL may provide a common voltage ELVSS to the opposite electrode 223 through the auxiliary wiring layer AW on the base portion BS.

The second organic insulating layer 211 may support the common power line WL and may extend from the base portion BS onto the connection portion CN. The first organic insulating layer 209 supporting the second organic insulating layer 211 may also extend from the base portion BS onto the connection portion CN.

The inorganic contact area ICA may also be located on the base portion BS adjacent to the connection portion CN. As described above with reference to FIGS. 6A and 6B, the inorganic contact area ICA may be formed when the bottom surface AW-B of the tip PT of the auxiliary wiring layer AW having the overhang structure or the bottom surface 214B of a portion of the third inorganic insulating layer 214 contacts the first inorganic encapsulation layer 310. FIG. 7A illustrates that the inorganic contact area ICA is formed because the bottom surface 214B of the portion of the third inorganic insulating layer 214 contacts the first inorganic encapsulation layer 310, as described above with reference to FIG. 6B.

According to an embodiment, FIG. 7A illustrates that the third organic insulating layer 213 includes the recess portion R. The recess portion R may be defined by a side surface of the third organic insulating layer 213 on the base portion BS. The third organic insulating layer 213 may be located not only on the base portion BS, but also on the connection portion CN. However, the third organic insulating layers 213 may be apart from each other to form the recess portion R, and the recess portion R may be formed on the third organic insulating layer 213 on the base portion BS.

The auxiliary wiring layer AW and the third inorganic insulating layer 214 may be located on the base portion BS and may not be located on the connection portion CN. The auxiliary wiring layer AW may be electrically connected to the common power line WL through the contact hole AWCNT defined in the third inorganic insulating layer 214 and the third organic insulating layer 213. Based on this structure, the auxiliary wiring layer AW may receive a common voltage ELVSS from the common power line WL.

The pixel-defining layer 215 on the third organic insulating layer 213 may be located on the base portion BS and the connection portion CN, and the pixel-defining layer 215 on the base portion BS and the pixel-defining layer 215 on the connection portion CN may be apart from each other. A space area between the third organic insulating layer 213 on the base portion BS and the third organic insulating layer 213 on the connection portion CN may overlap a space area between the pixel-defining layer 215 on the base portion BS and the pixel-defining layer 215 on the connection portion CN in a plan view.

The pixel-defining layer 215 may partially cover the auxiliary wiring layer AW to expose a portion of the auxiliary wiring layer AW on the base portion BS. As described below, the exposed portion may correspond to a contact area contacting the opposite electrode 223.

As described above with reference to FIG. 5, the first functional layer 222a and the second functional layer 222c may be arranged on the base portion BS, and portions of the first functional layer 222a and the second functional layer 222c may also be arranged on the connection portion CN. FIG. 7A illustrates the display apparatus taken along line VII-VII' of FIG. 5, in which edges of the first functional layer 222a and the second functional layer 222c are located on the base portion BS and do not extend onto the connection portion CN. The auxiliary wiring layer AW arranged along an edge of the base portion BS may be exposed through an area in which the first functional layer 222a and the second functional layer 222c do not extend onto the edge of the base portion BS.

The opposite electrode 223 may be located on the base portion BS and the connection portion CN and may be disconnected or separated by an overhang structure formed by the tip PT of the auxiliary wiring layer AW. According to another embodiment, the opposite electrode 223 may not be located on the connection portion CN, by adjusting a size of an opening area of a mask for forming the opposite electrode 223.

The opposite electrode 223 may form an electrode contact area ECA by contacting the portion of the auxiliary wiring layer AW, and the portion may be exposed by the pixel-defining layer 215. The electrode contact area ECA may be arranged above the tip PT of the auxiliary wiring layer AW. FIG. 7A illustrates that a width of the electrode contact area ECA is less than a protrusion length of the tip PT of the auxiliary wiring layer AW. However, the disclosure according to the invention is not limited thereto. In another embodiment, the width of the electrode contact area ECA may be greater than the protrusion length of the tip PT. The electrode contact area ECA may be dependent on the area of the auxiliary wiring layer AW, and the area may be exposed by the pixel-defining layer 215.

The opposite electrode 223 may receive a common voltage ELVSS from the auxiliary wiring layer AW through the electrode contact area ECA. Based on this structure, without a need to form an additional contact structure in an inner portion of the edge of the base portion BS, the opposite electrode 223 and the common power line WL may be electrically connected to each other, in an area adjacent to the edge of the base portion BS. Thus, an area in which the pixel electrode 221 may be arranged and an aperture ratio of the pixel PX may be increased.

In order to prevent damage to the common power line WL in a process (for example, an etching process) for forming the overhang structure whereby an end of the auxiliary wiring layer AW protrudes further from the side surface of the third organic insulating layer 213, the second inorganic insulating layer 212 may be located on the common power line WL. The second inorganic insulating layer 212 may be arranged such that at least a portion of the second inorganic insulating layer 212 overlaps the inorganic contact area ICA in a plan view. For example, the second inorganic insulating layer 212 may be between the base portion BS and each of the connection portions CN, and a portion of the second inorganic insulating layer 212 may overlap the inorganic contact area ICA in a plan view.

The organic encapsulation layer 320 of the encapsulation layer 300 may be located only on each base portion BS. However, the first and second inorganic encapsulation layers 310 and 330 may be continually formed to be located on the base portion BS and the connection portion CN. While the first and second inorganic encapsulation layers 310 and 330 may form the inorganic contact area ICA by contacting the bottom surface 214B of the third inorganic insulating layer 214 below the tip PT, the first and second inorganic encapsulation layers 310 and 330 may continually extend to contact each other on the connection portion CN.

FIG. 7A illustrates the cross-sectional structure between any one of the four connection portions CN illustrated in FIG. 5 and the base portion BS. However, the disclosure according to the invention is not limited thereto. Structures between the other connection portions CN illustrated in FIG. 5 and the base portion BS may also correspond to the structure described with reference to FIG. 7A.

Figure 8:
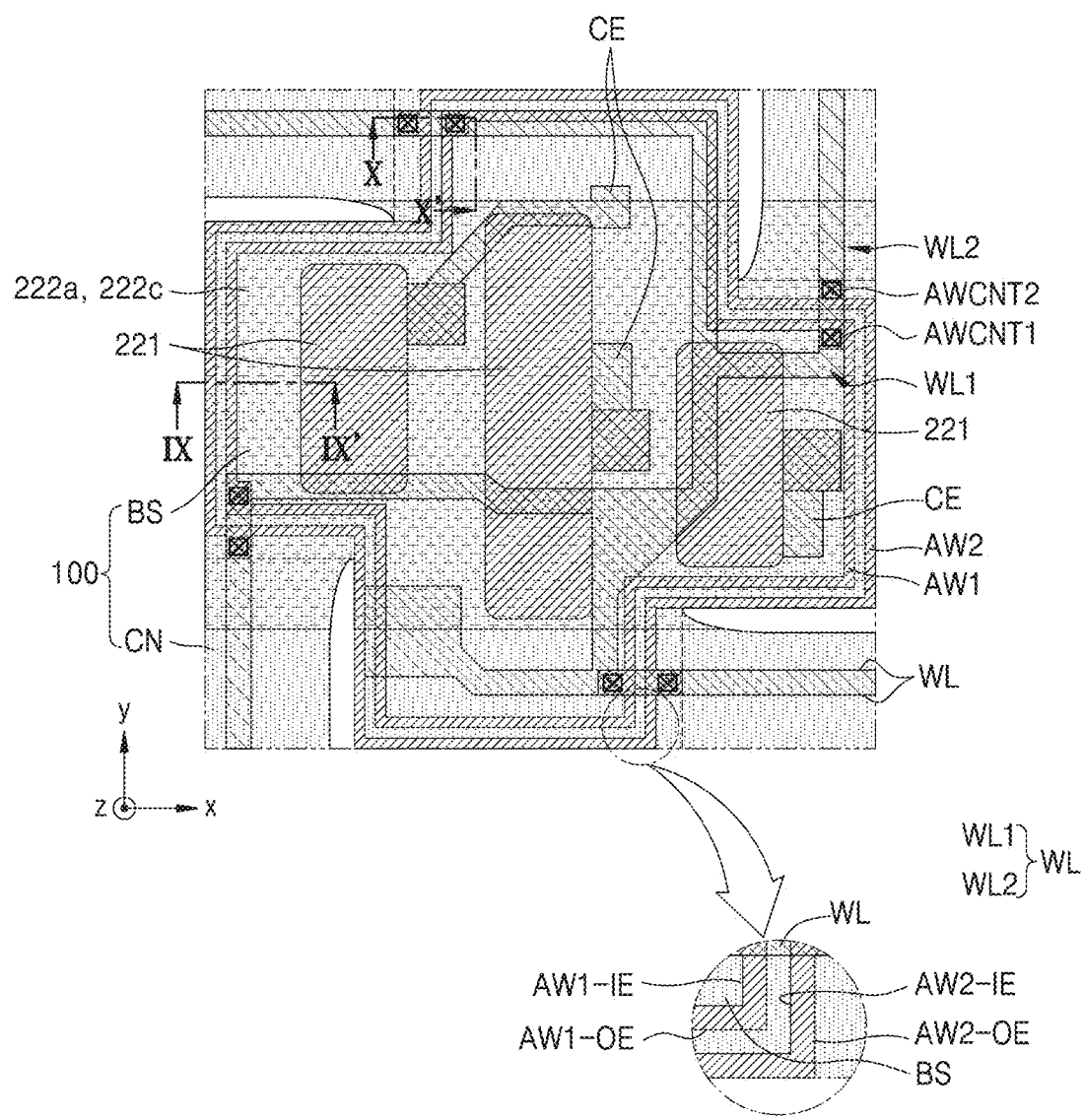
FIG. 8 is a schematic plan view of one or more layers of a basic unit of a display apparatus according to another embodiment.

Referring to FIG. 7B, the opposite electrode 223 may contact the auxiliary wiring layer AW through an electrode contact hole 223-CNT defined in the pixel-defining layer 215. The electrode contact hole 223-CNT may be located in an area of the base portion BS, in which the first functional layer 222a and the second functional layer 222c are not arranged. The opposite electrode 223 may receive the common voltage ELVSS from the auxiliary wiring layer AW through the electrode contact hole 223-CNT. FIG. 8 is a schematic plan view of one or more layers of a basic unit of a display apparatus according to another embodiment. Structures that are the same as the structures described above with reference to FIG. 5 will not be described, and the descriptions will be given by focusing on different structures.

A first auxiliary wiring layer AW1 and a second auxiliary wiring layer AW2 may be arranged on the base portion BS of the substrate 100. The first auxiliary wiring layer AW1 and the second auxiliary wiring layer AW2 may be arranged along an edge of the base portion BS and may be continually formed to entirely surround the pixel electrode 221 in a planar perspective (i.e., in a plan view). In other words, the first auxiliary wiring layer AW1 and the second auxiliary wiring layer AW2 may each have a closed-loop shape to enclose the pixel electrode 221 in the plan view. The second auxiliary wiring layer AW2 may be arranged to be adjacent to an outermost portion of the base portion BS, and the first auxiliary wiring layer AW1 may be arranged at an inner portion of the second auxiliary wiring layer AW2. That is, the first auxiliary wiring layer AW1 may be entirely surrounded by the second auxiliary wiring layer AW2 in the planar perspective (i.e., in a plan view). The first auxiliary wiring layer AW1 and the second auxiliary wiring layer AW2 may be apart from each other in the planar perspective (i.e., in a plan view).

The first auxiliary wiring layer AW1 may include a first inner edge AW1-IE toward an inner portion of the base portion BS and a first outer edge AW1_OE, which is opposite to the first inner edge AW1_IE. The second auxiliary wiring layer AW2 may include a second inner edge AW2-IE toward the inner portion of the base portion BS and a second outer edge AW2_OE, which is opposite to the second inner edge AW2_IE. The second outer edge AW2-OE may be the most adjacent to the outermost portion of the base portion BS.

According to an embodiment, as described hereinafter with reference to FIGS. 9 and 10, the first auxiliary wiring layer AW1 may include a first tip PT1 (FIGS. 9 and 10) protruding toward an outer portion of the base portion BS in a width direction of the first auxiliary wiring layer AW1, and the first tip PT1 may be generally formed along the first outer edge AW1-OE. However, the second auxiliary wiring layer AW2 may include a second tip PT2 (FIGS. 9 and 10) protruding toward the inner portion of the base portion BS in a width direction of the second auxiliary wiring layer AW2, and the second tip PT2 may be formed along the second inner edge AW2-IE, but may be partially formed. For example, the second auxiliary wiring layer AW2 located on a portion of the base portion BS may not include the second tip PT2. The portion may be connected to the connection portion CN. This aspect will become apparent by referring to the description with reference to FIGS. 9 and 10.

According to another embodiment, the first tip PT1 and the second tip PT2 may be generally formed along the first outer edge AW1-OE of the first auxiliary wiring layer AW1 and the second inner edge AW2-IE of the second auxiliary wiring layer AW2, respectively.

Figure 9:
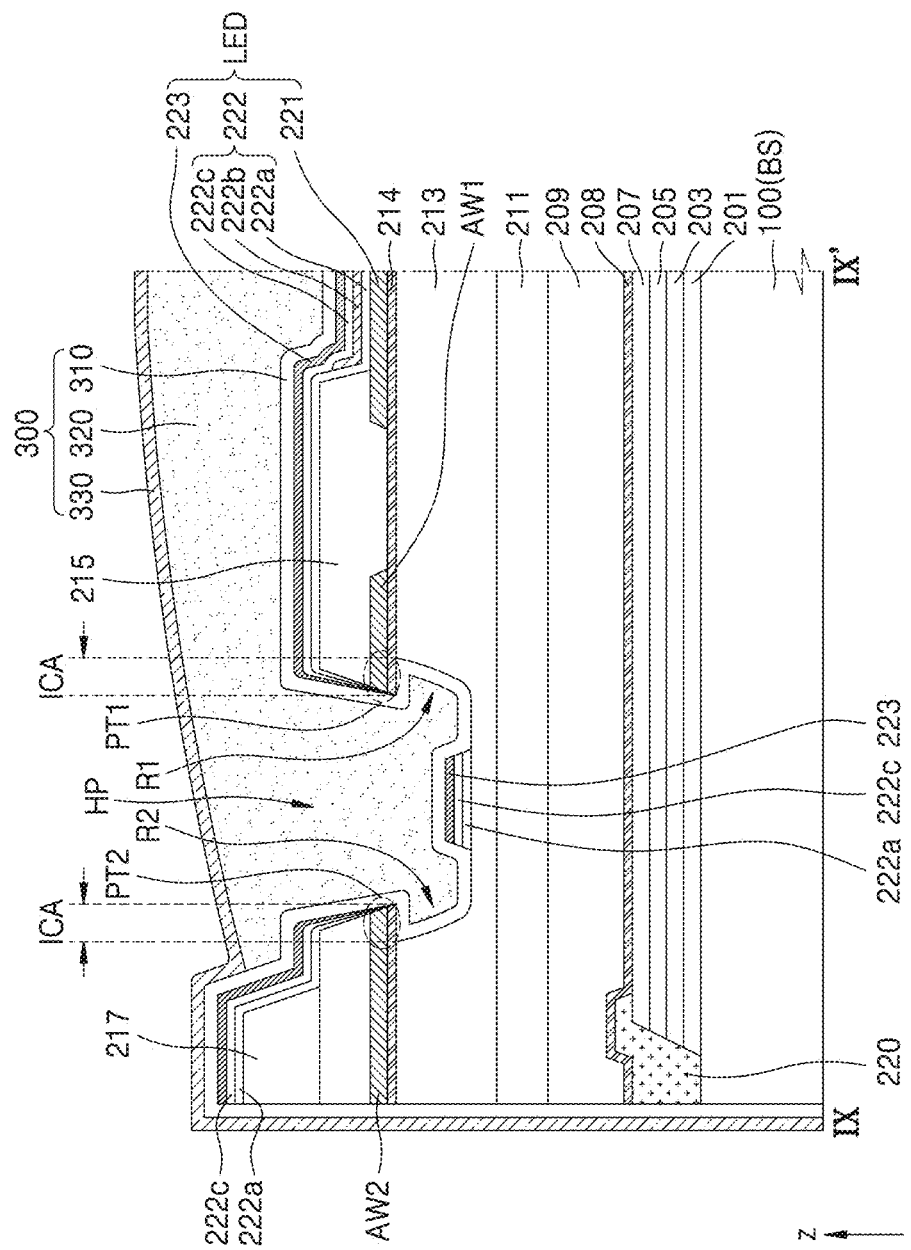
FIG. 9 is a cross-sectional view of a display apparatus taken along line IX-IX' of FIG. 8, according to another embodiment.

FIG. 9 is a cross-sectional view of a display apparatus taken along line IX-IX' of FIG. 8, according to another embodiment. The structures on the base portion BS may correspond to the structures described above with reference to FIGS. 6A and 6B. Hereinafter, descriptions of the same structures will not be given, and different structures will be mainly described.

Referring to FIG. 9, the first auxiliary wiring layer AW1 and the second auxiliary wiring layer AW2 may be located on the base portion BS of the substrate 100. The first auxiliary wiring layer AW1 and the second auxiliary wiring layer AW2 may be formed in the same layer and include the same material as the pixel electrode 221.

A portion of the first auxiliary wiring layer AW1 may extend in a horizontal direction (or a width direction of the first auxiliary wiring layer AW1), which is parallel with an upper surface of the substrate 100, and may protrude further toward the outside of the base portion BS from a side surface of an organic insulating layer directly below the first auxiliary wiring layer AW1, for example, the third organic insulating layer 213, so as to form the first tip PT1. A first recess portion R1, which is a sunken space, may be formed below the first tip PT1. A depth of the first recess R1 may be, for example, less than a thickness of the third organic insulating layer 213. As another example, the depth of the first recess portion R1 may be sufficient to penetrate the third organic insulating layer 213. As another example, the depth of the first recess portion R1 may be substantially the same as thicknesses of the third organic insulating layer 213, the second organic insulating layer 211, and the first organic insulating layer 209.

Similarly, a portion of the second auxiliary wiring layer AW2 may extend in the horizontal direction (or a width direction of the second auxiliary wiring layer AW2), which is parallel with the upper surface of the substrate 100, and may protrude further toward the inside of the base portion B from the side surface of the third organic insulating layer 213, so as to form the second tip PT2. A second recess portion R2, which is a sunken space, may be formed below the second tip PT2. A depth of the second recess portion R2 may be substantially the same as the depth of the first recess portion R1. The second tip PT2 may face the first tip PT1.

The first and second recess portions R1 and R2 may be formed by removing a portion of the organic insulating layer below the first auxiliary wiring layer AW1 and a portion of the organic insulating layer below the second auxiliary wiring layer AW2, respectively. The first and second recess portions R1 and R2 may be defined by a side surface of the organic insulating layer, portions of which are removed. FIG. 9 illustrates that the first and second recess portions R1 and R2 are formed by removing portions of the third organic insulating layer 213. The first recess portion R1 and the second recess portion R2 may face opposite directions. It may be understood that one groove portion HP may be defined by the first and second recess portions R1 and R2, and the first auxiliary wiring layer AW1 and the second auxiliary wiring layer AW2 may be apart from each other with respect to the groove portion HP.

Due to an overhang structure formed by the first tip PT1 of the first auxiliary wiring layer AW1 and the second tip PT2 of the second auxiliary wiring layer AW2, the first functional layer 222a and/or the second functional layer 222c of the intermediate layer 222 may be disconnected or separated based on each of the first and second tips PT1 and PT2. With respect to this aspect, FIG. 9 illustrates that each of the first functional layer 222a and the second functional layer 222c is separated by each of the first and second tips PT1 and PT2, and the first functional layer 222a and the second functional layer 222c are spaced apart from each other. For example, while most portions of each of the first functional layer 222a and the second functional layer 222c may be located on the pixel-defining layer 215, one or more portions of each of the first functional layer 222a and the second functional layer 222c may remain on bottom surfaces (or a bottom surface of the groove portion HP) of the first and second recess portions R1 and R2.

Similarly, the opposite electrode 223 may be disconnected or separated due to the overhang structure. With respect to this aspect, FIG. 9 illustrates that the opposite electrode 223 is separated by each of the first and second tips PT1 and PT2, and portions of the opposite electrode 223 are spaced apart from each other. For example, while most portions of the opposite electrode 223 may be located on the pixel-defining layer 215, one or more portions of the opposite electrode 223 may remain on the bottom surfaces (or the bottom surface of the groove portion HP) of the first and second recess portions R1 and R2.

The third inorganic insulating layer 214 may be arranged below the first auxiliary wiring layer AW1 and the second auxiliary wiring layer AW2. The third inorganic insulating layer 214 may include portions extending in the horizontal direction (or the width directions of the first and second auxiliary wiring layers AW1 and AW2) to protrude further from the side surface of the third organic insulating layer 213, the side surface defining each of the first and second recess portions R1 and R2. The protruding portions of the third inorganic insulating layer 214 may be arranged below the first tip PT1 of the first auxiliary wiring layer AW1 and the second tip PT2 of the second auxiliary wiring layer AW2. In this case, an upper surface of each of the first and second recess portions R1 and R2 may correspond to the bottom surface 214B of the third inorganic insulating layer 214, and the protruding portions of the third inorganic insulating layer 214 and the first and second tips PT1 and PT2 of the first and second auxiliary wiring layers AW1 and AW2 may form an overhang structure.

The bottom surface 214B of the protruding portions of the third inorganic insulating layer 214 may directly contact at least one inorganic encapsulation layer provided in the encapsulation layer 300. For example, when the first inorganic encapsulation layer 310 of the encapsulation layer 300 directly contacts the bottom surface 214B of the protruding portions of the third inorganic insulating layer 214 including an inorganic insulating material, the inorganic contact area ICA may be formed.

The pixel-defining layer 215 may be arranged on the first and second auxiliary wiring layers AW1 and AW2, and the pixel-defining layer 215 may include a penetration portion corresponding to the groove portion HP including the first and second recess portions R1 and R2. It may be understood that a portion of the pixel-defining layer 215, the portion being arranged on the first auxiliary wiring layer AW1, and a portion of the pixel-defining layer 215, the portion being arranged on the second auxiliary wiring layer AW2, may be apart from each other, based on the penetration portion.

A spacer 217 may be arranged above the second auxiliary wiring layer AW2. The spacer 217 may be arranged on the pixel-defining layer 215. The spacer 217 may be formed along an edge of the base portion BS and may surround the pixels PX in a planar perspective (i.e., in a plan view). The spacer 217 may be located outside the second tip PT2 in the planar perspective (i.e., in a plan view). The spacer 217 may include an organic insulating material, such as PI. The spacer 217 may include the same material as the pixel-defining layer 215. Portions of the first functional layer 222a, the second functional layer 222c, and the opposite electrode 223 of the intermediate layer 222 may be located on the spacer 217.

The first inorganic encapsulation layer 310 may entirely cover the opposite electrode 223. Also, the first inorganic encapsulation layer 310 may extend downwardly, from an upper portion of the opposite electrode 223 toward the substrate 100, and may continually extend to cover the bottom surface 214B of the third inorganic insulating layer 214, the side surfaces of the first through third organic insulating layers 209, 211, and 213, and the side surface of the substrate 100.

The organic encapsulation layer 320 may be arranged on the first inorganic encapsulation layer 310 and may be arranged only above the base portion BS. The organic encapsulation layer 320 may be arranged in the first and second recess portions R1 and R2 and may fill the groove HP defined by the first and second recess portions R1 and R2. Based on this structure, penetration of external materials or moisture into the base portion BS may be adequately prevented.

A tip end of the organic encapsulation layer 320 may be located at a side of the spacer 217. The organic encapsulation layer 320 may be formed by coating the substrate 100 with a monomer and curing the monomer. Here, a flow of the monomer may be controlled via the spacer 217. A thickness of the monomer, that is, a thickness of the organic encapsulation layer 320 may be adjusted. Like this, the spacer 217 may perform a function of a partition wall with respect to the organic encapsulation layer 320.

The second inorganic encapsulation layer 330 may also continually extend to cover an upper surface of the organic encapsulation layer 320 and the side surface of the substrate 100. Thus, moisture penetration in a lateral direction of the display apparatus, for example, through the side surface of the organic material layer 220 and the side surfaces of the first through third organic insulating layers 209, 211, and 213, may be prevented. The first and second inorganic encapsulation layers 310 and 330 may be continually formed to be located on the base portion BS and the connection portion CN.

Figure 10:
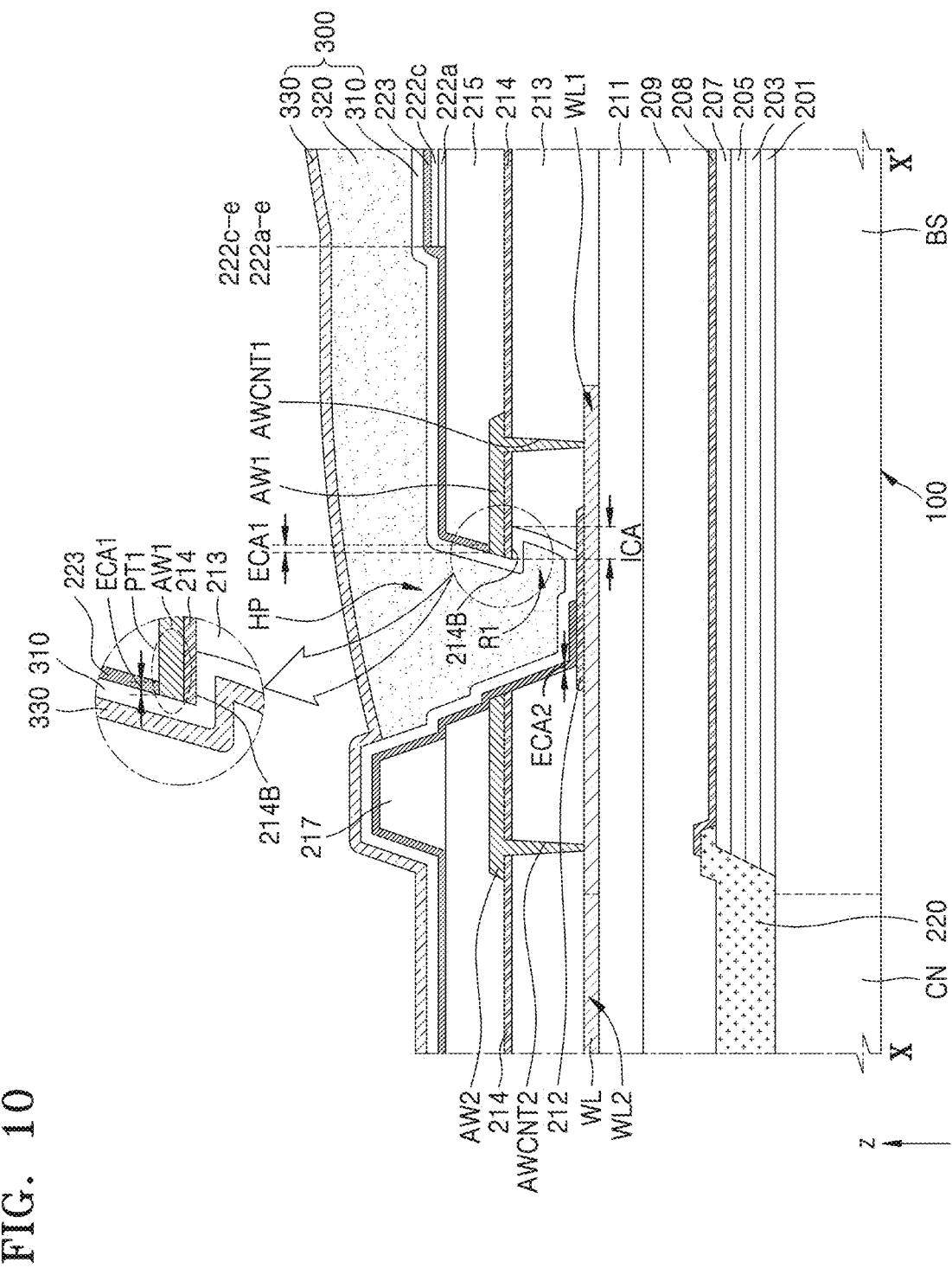
FIG. 10 is a cross-sectional view of a display apparatus taken along line X-X' of FIG. 8, according to another embodiment.

FIG. 10 is a cross-sectional view of a display apparatus taken along line X-X' of FIG. 8, according to another embodiment. Components that are the same as the components described above with reference to FIGS. 7A and 9 will not be described, and different aspects will be mainly described below.

Referring to FIG. 10, the first auxiliary wiring layer AW1 may be located on the base portion BS of the substrate 100. An end of the first auxiliary wiring layer AW1 may form the first tip PT1, and the first recess portion R1 may be formed below the first tip PT1, as described above with reference to FIG. 9.

The first auxiliary wiring layer AW1 may be electrically connected to the common power line WL through a first contact hole AWCNT1 defined in the third inorganic insulating layer 214 and the third organic insulating layer 213. Based on this structure, the first auxiliary wiring layer AW1 may receive the common voltage ELVSS from the common power line WL.

The pixel-defining layer 215 may partially cover the first auxiliary wiring layer AW1 to expose a portion of the first auxiliary wiring layer AW1 on the base portion BS. The exposed portion may correspond to a contact area on the pixel-defining layer 215, the contact area contacting the opposite electrode 223.

As described above with reference to FIG. 5, the first functional layer 222a and the second functional layer 222c may be arranged on the base portion BS, and portions of the first functional layer 222a and the second functional layer 222c may also be arranged on the connection portion CN. FIG. 10 illustrates a cross-sectional structure of a display apparatus taken along line X-X' of FIG. 8, in which an edge 222a-e of the first functional layer 222a and an edge 222c-e of the second functional layer 222c are located on the base portion BS and do not extend onto the connection portion CN. The first auxiliary wiring layer AW1 may be exposed through an area in which the first functional layer 222a and the second functional layer 222c do not extend onto the edge of the base portion BS.

The opposite electrode 223 may be formed to be located on the base portion BS and the connection portion CN and may be disconnected or separated by an overhang structure formed by the first tip PT1 of the first auxiliary wiring layer AW1. According to another embodiment, the opposite electrode 223 may not be located on the connection portion CN, by adjusting a size of an opening area of a mask for forming the opposite electrode 223.

The opposite electrode 223 may form a first electrode contact area ECA1 by contacting a portion of the first auxiliary wiring layer AW1, and the portion may be exposed by the pixel-defining layer 215. The first electrode contact area ECA1 may be arranged above the first tip PT1 of the first auxiliary wiring layer AW1. The first electrode contact area ECA1 may be dependent on the area of the first auxiliary wiring layer AW1, and the area may be exposed by the pixel-defining layer 215. The opposite electrode 223 may receive the common voltage ELVSS from the first auxiliary wiring layer AW1 through the first electrode contact area ECA1. Based on this structure, without a need to form an additional contact structure at an inner portion of the edge of the base portion BS, the opposite electrode 223 and the common power line WL may be electrically connected to each other in an area adjacent to the edge of the base portion BS. Thus, an area in which the pixel electrode 221 may be arranged and an aperture ratio of the pixel PX may be increased.

The second auxiliary wiring layer AW2 may be arranged on the base portion BS of the substrate 100. The second auxiliary wiring layer AW2 located on a portion of the base portion BS, the portion being connected to the connection portion CN, may not include the second tip PT2, as illustrated in FIG. 9. Thus, when the opposite electrode 223 is arranged on the base portion BS and the connection portion CN, the opposite electrode 223 may extend from the base portion BS onto the connection portion CN without being disconnected by the second auxiliary wiring layer AW2. The opposite electrode 223 may be located above and below the second auxiliary wiring layer AW2 and may cover edges of the pixel-defining layer 215 and the third organic insulating layer 213 forming a step difference.

Also, the second recess portion R2 as illustrated in FIG. 9 may not be formed on an organic insulating layer below the second auxiliary wiring layer AW2 located on the portion of the base portion BS, and the portion may be connected to the connection portion CN. Thus, the groove portion HP may be defined by the first recess portion R1, and the first auxiliary wiring layer AW1 and the second auxiliary wiring layer AW2 may be apart from each other with respect to the groove portion HP. Also, the pixel-defining layer 215 may include a penetration portion corresponding to the groove portion HP.

The second auxiliary wiring layer AW2 may be electrically connected to the common power line WL through a second contact hole AWCNT2 defined in the third organic insulating layer 213. The second auxiliary wiring layer AW2 may receive the common voltage ELVSS through the common power line WL and may not be electrically floated. Based on this structure, adverse effects due to an external electrostatic phenomenon may be minimized.

While the organic encapsulation layer 320 of the encapsulation layer 300 may be located only on each base portion BS, the first and second inorganic encapsulation layers 310 and 330 may be continually formed to be located on the base portion BS and the connection portion CN. The first and second inorganic encapsulation layers 310 and 330 may contact the bottom surface 214B of the third inorganic insulating layer 214 below the first tip PT1, so as to form the inorganic contact area ICA. Also, the first and second inorganic encapsulation layers 310 and 330 may continually extend to contact each other on the connection portion CN.

The organic encapsulation layer 320 may be arranged in the first recess portion R1 and may fill the groove portion HP defined by the first recess portion R1. A tip end of the organic encapsulation layer 320 may be located at a side of the spacer 217. The organic encapsulation layer 320 may be formed by coating the substrate 100 with a monomer and curing the monomer. Here, a flow of the monomer may be controlled via the spacer 217. A thickness of the monomer, that is, a thickness of the organic encapsulation layer 320, may be adjusted. Like this, the spacer 217 may function as a partition wall with respect to the organic encapsulation layer 320.

Figure 11:
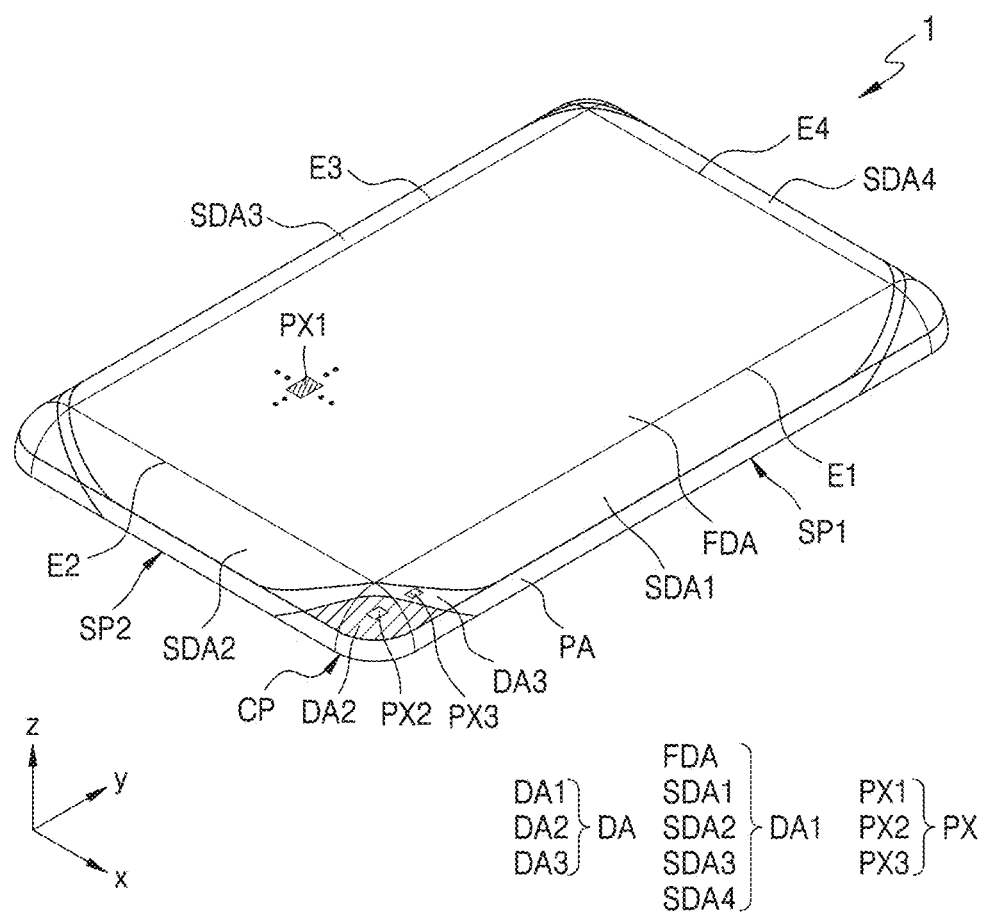
FIG. 11 is a schematic perspective view of a display apparatus according to another embodiment.

FIG. 11 is a schematic perspective view of the display apparatus 1 according to another embodiment.

Referring to FIG. 11, the display apparatus 1 may include a display area DA and a peripheral area PA outside the display area DA. The display area DA may include a first display area DA1, a second display area D2, and a third display area DA3. The display apparatus 1 may provide an image through arrays of a plurality of pixels PX arranged in the display area DA. The plurality of pixels PX may be arranged in the first through third display areas DA1, DA2, and DA3. For example, the first through third display areas DA1 through DA3 may include the first through third pixels PX1, PX2, and PX3, respectively.

The display apparatus 1 may provide first through third images by using light emitted from the pixels PX arranged in the first through third display areas DA1, DA2, and DA3. In some embodiments, the first through third images may be portions of an image provided by the display area DA of the display apparatus 1. Also, in some embodiments, the display apparatus 1 may provide the first through third images that are separate images.

As illustrated in FIG. 11, the display apparatus 1 may have a square shape in a planar perspective (i.e., in a plan view), where corner portions CP of the square shape may be rounded. However, the disclosure according to the invention is not limited thereto. The display apparatus 1 may have various shapes, such as shapes of polygons, such as a triangle, a square, etc., a shape of a circle, a shape of an oval, etc. Hereinafter, for convenience of description, a case where the display apparatus 1 has a shape of a square having rounded corner portions CP, in a planar perspective, will be mainly described.

The first display area DA1 may include a front display area FDA having a square shape in the planar perspective (i.e., in a plan view), and first through fourth side display areas SDA1, SDA2, SDA3, and SDA4 adjacent to first through fourth edges E1, E2, E3, and E4 of the front display area FDA, respectively. The first display area DA1 may be partially bent. In some embodiments, the front display area FDA of the first display area DA1 may be flat, and each of the first through fourth side display areas SDA1, SDA2, SDA3, and SDA4 may be bent by having a certain curvature. The curvatures of the first through fourth side display areas SDA1, SDA2, SDA3, and SDA4 may be the same as or different from one another. Because the first display area DA1 may be partially bent, the aesthetic sense of the display apparatus 1 may be improved.

The second display area DA2 may be arranged at a corner of the first display area DA1 to be apart from the first display area DA1. The third display area DA3 may be arranged between the first display area DA1 and the second display area DA2. The third display area DA3 may be adjacent to a corner of the front display area FDA of the first display area DA1, the first side display area SDA1, and/or the second side display area SDA2. Also, the third display area DA3 may be adjacent to the second display area DA2. In some embodiments, the display apparatus 1 may include four second display areas DA2 and/or four third display areas DA3.

The peripheral area PA may be an area not providing an image and may correspond to a non-display area. The peripheral area PA may entirely or partially surround the display area DA. A driver, etc. for providing an electrical signal or power to the pixels PX may be arranged in the peripheral area PA. A pad, which corresponds to an area in which an electronic element or a printed circuit board may be electrically connected, may be arranged in the peripheral area PA. The driver may also be arranged in the third display area DA3.

Each of four side portions SP of the display apparatus 1 may be bent by having a certain curvature, thereby having a surface curved toward a different direction. For example, a first side portion SP1 may have a surface curved toward a direction of a plane including an x direction and a y direction (that is, an x-z plane). A second side portion SP2 may have a surface curved toward a direction of a plane including a y direction and a z direction (that is, a y-z plane).

Each of the four corner portions CP of the display apparatus 1 may be arranged between two adjacent side portions SP and may be adjacent to two side portions SP that are bent to form different curved surfaces. Because the corner portions CP may connect the two side portions SP, curved surfaces of the corner portions CP may include curved surfaces continually formed in various directions.

In order to form the display areas, that is, the second display area DA2 and/or the third display area DA3, in the corner portions CP, one or more portions of components arranged in the corner portions CP may have to be contracted and other portions may have to be stretched. Thus, the configurations and the structures of the display apparatus 1 described above with reference to FIGS. 1 through 10 may be applied to the display apparatus 1 of FIG. 11, for example, in order to form the second display area DA2 of the display apparatus 1 of FIG. 11. The descriptions above are mainly given with respect to the display apparatus. However, the disclosure according to the invention is not limited thereto. In other words, a method of manufacturing the display apparatus may also be included in the scope of the disclosure.

As described above, according to the one or more of the above embodiments of the disclosure, a display apparatus having a high resolution and a changeable shape and capable of increasing an aperture ratio of a pixel may be realized.

Also, a display apparatus, which makes a patterning process convenient, may be provided. However, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a substrate including a base portion and a plurality of connection portions, the plurality of connection portions extending from the base portion in different directions from each other;
   a pixel circuit arranged on the base portion and including a thin-film transistor and a storage capacitor;
   an organic insulating layer on the pixel circuit;
   a pixel electrode arranged on the organic insulating layer and electrically connected to the pixel circuit;
   a first auxiliary wiring layer arranged on the organic insulating layer;
   an opposite electrode overlapping the pixel electrode in a plan view; and
   an emission layer between the pixel electrode and the opposite electrode,
   wherein the organic insulating layer defines a first recess portion, the first auxiliary wiring layer has a first tip protruding from a first side surface of the organic insulating layer, in a width direction of the first auxiliary wiring layer and the first side surface defines the first recess portion.

2. The display apparatus of claim 1, wherein the first auxiliary wiring layer includes a same material as the pixel electrode.

3. The display apparatus of claim 1, wherein the first auxiliary wiring layer has a closed-loop shape to surround an entirety of the pixel electrode in the plan view.

4. The display apparatus of claim 1, wherein the opposite electrode contacts a portion of the first auxiliary wiring layer.

5. The display apparatus of claim 4, further comprising a pixel-defining layer arranged on the pixel electrode and defining an opening overlapping the pixel electrode in the plan view,
   wherein the pixel-defining layer covers a part of the first auxiliary wiring layer such that the portion of the first auxiliary wiring layer is exposed.

6. The display apparatus of claim 4, wherein the opposite electrode contacts the portion of the first auxiliary wiring layer above the first tip.

7. The display apparatus of claim 1, further comprising a common power line arranged on the substrate,
   wherein the first auxiliary wiring layer is electrically connected to the common power line.

8. The display apparatus of claim 7, wherein the common power line includes:
   a first portion located on the base portion; and
   a second portion extending from the first portion toward at least one of the plurality of connection portions.

9. The display apparatus of claim 1, wherein the opposite electrode includes portions separated by the first tip.

10. The display apparatus of claim 1, further comprising a functional layer between the pixel electrode and the opposite electrode,
    wherein the functional layer includes portions separated by the first tip.

11. The display apparatus of claim 1, further comprising an inorganic insulating layer arranged between the organic insulating layer and the pixel electrode.

12. The display apparatus of claim 11, wherein the inorganic insulating layer includes a portion protruding from the first side surface of the organic insulating layer in the width direction of the first auxiliary wiring layer, and the portion of the inorganic insulating layer is arranged below the first tip.

13. The display apparatus of claim 1, further comprising an encapsulation layer covering the opposite electrode and including at least one inorganic encapsulation layer and at least one organic encapsulation layer.

14. The display apparatus of claim 1, further comprising a second auxiliary wiring layer apart from the first auxiliary wiring layer.

15. The display apparatus of claim 14, wherein the second auxiliary wiring layer includes a same material as the pixel electrode and the first auxiliary wiring layer.

16. The display apparatus of claim 14, wherein the organic insulating layer further defines a second recess portion recessed in an opposite direction to the first recess portion.

17. The display apparatus of claim 16, wherein the second auxiliary wiring layer includes a second tip facing the first tip of the first auxiliary wiring layer and protruding from a second side surface of the organic insulating layer, and the second side surface defines the second recess portion.

18. The display apparatus of claim 14, further comprising a spacer arranged above the second auxiliary wiring layer and surrounding an entirety of the base portion in the plan view.

19. The display apparatus of claim 14, further comprising an encapsulation layer covering the opposite electrode and including at least one inorganic encapsulation layer and at least one organic encapsulation layer.

20. The display apparatus of claim 19, wherein a portion of the at least one organic encapsulation layer is arranged in the first recess portion.

* * * * *